United States Patent [19]

Guckel et al.

[11] Patent Number: 5,327,033

[45] Date of Patent: Jul. 5, 1994

[54] MICROMECHANICAL MAGNETIC DEVICES

[75] Inventors: Henry Guckel; Todd R. Christenson; Kenneth J. Skrobis, all of Madison, Wis.

[73] Assignee: Wisconsin Alumni Research Foundation, Madison, Wis.

[21] Appl. No.: 998,947

[22] Filed: Dec. 30, 1992

Related U.S. Application Data

[62] Division of Ser. No. 718,536, Jun. 24, 1991, Pat. No. 5,206,983.

[51] Int. Cl.$^5$ .................. H02K 15/00; H02K 57/00
[52] U.S. Cl. .................. 310/40 MM; 310/42; 310/DIG. 6
[58] Field of Search ............ 310/40 MM, 42, 43, 45, 310/254, 261, 267, 268, 309, DIG. 6, 156

[56] References Cited

U.S. PATENT DOCUMENTS

| | | | |
|---|---|---|---|
| 3,449,221 | 6/1969 | Thomas | 430/323 |
| 3,535,137 | 10/1970 | Haller et al. | 427/553 |
| 3,886,584 | 5/1975 | Cook, Jr. et al. | 257/410 |
| 3,984,582 | 10/1976 | Feder et al. | 430/296 |
| 4,018,938 | 4/1977 | Feder et al. | 430/296 |
| 4,035,522 | 7/1977 | Hatzakis | 430/5 |
| 4,107,351 | 8/1978 | James et al. | 430/323 |
| 4,351,653 | 9/1982 | Becker et al. | 55/394 |
| 4,422,905 | 12/1983 | Becker et al. | 205/75 |
| 4,493,753 | 1/1985 | Becker et al. | 205/73 |
| 4,541,977 | 9/1985 | Becker et al. | 264/102 |
| 4,563,250 | 1/1986 | Becker et al. | 205/50 |
| 4,563,251 | 1/1986 | Becker et al. | 205/50 |
| 4,661,212 | 4/1987 | Ehrfeld et al. | 205/75 |
| 4,693,791 | 9/1987 | Becker et al. | 205/50 |
| 4,694,548 | 9/1987 | Ehrfeld et al. | 205/75 |

(List continued on next page.)

FOREIGN PATENT DOCUMENTS 0287945 10/1988 European Pat. Off. .
0403179 12/1990 European Pat. Off. .
2382127 9/1978 France .

OTHER PUBLICATIONS

P. Hagman, et al., "Fabrication of Microstructures of Extreme Structural Heights by Reaction Injection Molding," International Polymer Processing IV, vol. 3, 1989, pp. 188–195.

Menz et al., "The LIGA Technique-a Novel Concept for Microstructures and the Combination with Si-Technologies by Injection Molding", (MEMS) 1991, pp. 69–73.

Gannon, "Magic Micromachine", Popular Science, Mar. 1989, pp. 88–90, 143.

Brochure (in German) "Die LIGA Technik", by MicroParts, Gesellschaft, 1990.

E. W. Becker, et al., "Fabrication on Microstructures with High Aspect Ratios and Great Structural Heights by Synchrotron Radiation Lithography Galvano-forming, and Plastic Moulding (LIGA process)", Microelec- (List continued on next page.)

*Primary Examiner*—Steven L. Stephan
*Assistant Examiner*—D. R. Haszko
*Attorney, Agent, or Firm*—Foley & Lardner

[57] ABSTRACT

Micromechanical devices are formed on a substrate using a sacrificial layer deep X-ray lithography process to produce a rotating microrotor which is driven magnetically. The rotor typically has a diameter of a few hundred microns or less and is formed as a free structure which is assembled onto a hub formed on a substrate. Stator pole pieces are formed on the substrate of a ferromagnetic material surrounding the rotor, and are also preferably formed by a deep X-ray lithography process followed by electroplating of a ferromagnetic material such as nickel. The stator pole pieces are supplied with magnetic flux, such as from a current flowing through a conductor surrounding the magnetic pole pieces which is integrated with the pole pieces on the substrate. Separate electromagnets can also be utilized to provide the magnetic flux to the pole pieces to provide a rotating magnetic field in the region of the rotor to drive the rotor.

13 Claims, 19 Drawing Sheets

U.S. PATENT DOCUMENTS

| | | |
|---|---|---|
| 4,698,285 | 10/1987 | Ehrfeld et al. ............................ 430/5 |
| 4,705,559 | 11/1987 | Ehrfeld et al. ......................... 29/854 |
| 4,705,605 | 11/1987 | Becker et al. ........................... 205/75 |
| 4,738,010 | 4/1988 | Ehrfeld et al. .................... 29/898.12 |
| 4,780,382 | 10/1988 | Stengl et al. ............................. 430/5 |
| 4,784,935 | 11/1988 | Ehrfeld et al. ........................ 430/321 |
| 4,797,211 | 1/1989 | Ehrfeld et al. .................. 210/321.84 |
| 4,872,888 | 10/1989 | Ehrfeld et al. ........................... 55/16 |
| 4,943,750 | 7/1990 | Howe et al. ........................... 310/309 |
| 5,013,954 | 5/1991 | Shibaike et al. ...................... 310/309 |
| 5,093,594 | 3/1992 | Mehregany ............................ 310/82 |
| 5,113,100 | 5/1992 | Taghezout ..................... 310/40 MM |
| 5,189,777 | 3/1993 | Guckel et al. .......................... 29/424 |
| 5,191,251 | 3/1993 | Paratte ................................. 310/309 |
| 5,206,983 | 5/1993 | Guckel et al. ......................... 29/598 |

OTHER PUBLICATIONS tronic Engineering, vol. 4, No. 1, May 1986, pp. 35-36.

W. Ehrfeld, et al., "Fabrication of Microstructures Using the LIGA Process", Proc. IEEE Micro Robots and Teleoperators Workshop, Nov. 9-11, 1987, pp. 1-11.

W. Ehrfeld, et al., "Microfabrication of Sensors and Actuators for Microrobots," Proc. IEEE International Workshop on Intelligent Robots and Systems, Tokyo, Japan, Oct. 31-Nov. 2, 1988, pp. 3-7.

W. Ehrfeld, "Three Dimensional Microfabrication Using Synchrotron Radiation," International Symposium on X-Ray Synchrotron Radiation and Advances Science and Technology, Feb. 15-16, 1990, pp. 121-141.

W. Ehrfeld, et al., "LIGA Process: Sensor Construction Techniques Via X-Ray Lithography," Technical Digest, IEEE Solid State Sensor and Actuator Workshop, 1988, pp. 1-4.

H. Guckel, et al., "Deep X-Ray and UV Lithographies for Micromechanics", Tecnical Digest, IEEE Solid State Sensor and Actuator Workshop, Hilton Head, South Carolina, Jun. 4-7, 1990, pp. 118-122.

H. Guckel, et al., "Microstructure Sensors," International Electrion Devices Meeting (IEDM), San Francisco, Calif., Dec., 1990.

H. Guckel, et al., "Fabrication of Assembled Micromechanical Components via Deep X-Ray Lithography", Proceedings of IEEE Micro Electro Mechanical Systems (MEMS) 1991, Nara, Japan, Jan. 30-Feb. 2, 1991.

PiRL: Polyimide Release Layer, brochure from Brewer Science, Inc., undated.

Roger T. Howe, et al., "Silicon Micromechanics: Sensors and Actuators on a Chip", IEEE Spectrum, Jul., 1990, pp. 29-35.

K. Yanagisaqwaa, et al., "Magnetic Micro-Actuator", IEEE Micro Electro-Mechanical Systems 30, Nara, Japan, Jan. 1991, pp. 120-124.

"Mini-Gears Show Their Mettle", Design Engineering, Jun. 1991, London, England, p. 24.

MICROMECHANICAL MAGNETIC DEVICES

This invention was made with United States government support awarded by the National Science Foundation (NSF), Grant #EET-88-15285. The United States Government has certain rights in this invention.

This is a divisional of Ser. No. 07/718,536 filed on Jun. 24, 1991, U.S. Pat. No. 5,206,983.

FIELD OF THE INVENTION

This invention pertains generally to the field of semiconductor and micromechanical devices and processing techniques therefor, and particularly to microminiature magnetic devices.

BACKGROUND OF THE INVENTION

Deep X-ray lithography involves a substrate which is covered by thick photoresist, typically severally hundred microns in thickness, which is exposed through a mask by X-rays. X-ray photons are much more energetic than optical photons, which makes complete exposure of thick photoresist films feasible and practical. Furthermore, since X-ray photons are short wavelength particles, diffraction effects which typically limit device dimensions to two or three wavelengths of the exposing radiation are absent for mask dimensions above 0.1 micron. If one adds to this the fact that X-ray photons are absorbed by atomic processes, standing wave problems, which typically limit exposures of thick photoresist by optical means, become an non-issue for X-ray exposures. The use of a synchrotron for the X-ray source yields high flux densities—several watts per square centimeter—combined with excellent collimation to produce thick photoresist exposures without any horizontal run-out. Locally exposed patterns should therefore produce vertical photoresist walls if a developing system with very high selectivity between exposed and unexposed photoresist is available. This requirement is satisfied for polymethylmethacrylate (PMMA) as the X-ray photoresist and an aqueous developing system. See, H. Guckel, et al., "Deep X-Ray and UV Lithographies For Micromechanics" Technical Digest, Solid State Sensor and Actuator Workshop, Hilton Head, S.C., Jun. 4-7, 1990, pp. 118-122.

Deep X-ray lithography may be combined with electroplating to form high aspect ratio structures. This requires that the substrate be furnished with a suitable plating base prior to photoresist application. Typically this involves a sputtered film of adhesive metal such as chromium or titanium which is followed by a thin film of the metal which is to be plated. Exposure through a suitable mask and development are followed by electroplating. This results, after cleanup, in fully attached metal structures with very high aspect ratios. Such structures were first reported by W. Ehrfeld and coworkers at the Institute for Nuclear Physics at the University of Karlsruhe in West Germany. Ehrfeld termed the process "LIGA" based on the first letters of the German words for lithography and electro-plating. A general review of the LIGA process is given in the article by W. Ehrfeld, et al., "LIGA Process: Sensor Construction Techniques Via X-Ray Lithography" Technical Digest IEEE Solid-State Sensor and Actuator Workshop, 1988, pp. 1-4.

A difficulty with the original LIGA process is that it can only produce fully attached metal structures. This restricts the possible application areas severely and unnecessarily.

The addition of a sacrificial layer to the LIGA process facilitates the fabrication of fully attached, partially attached, or completely free metal structures. Because device thicknesses are typically larger than 10 microns and smaller than 300 microns, freestanding structures will not distort geometrically if reasonable strain control for the plated film is achieved. This fact makes assembly in micromechanics possible and thereby leads to nearly arbitrary three-dimensional structures. See H. Guckel, et al., "Fabrication of Assembled Micromechanical Components via Deep X-Ray Lithography," Proceedings of IEEE Micro Electro Mechanical Systems, Jan. 30-Feb. 2, 1991, pp. 74-79.

SUMMARY OF THE INVENTION

In accordance with the present invention, micromechanical devices are formed on a substrate utilizing a sacrificial layer deep X-ray lithography process to produce a rotating micropart or rotor which is driven magnetically. The rotor, which typically will have a diameter of a few hundred microns or less, is formed as a free structure which is assembled onto a hub formed on the substrate. The rotor may be formed to have low-reluctance and high-reluctance paths through it. Surrounding the rotor on the substrate are stator pole pieces which are structured to channel magnetic flux to the rotor. Both the rotor and the stator pole pieces are formed of a ferromagnetic material, such as nickel, which is well suited to providing a magnetic flux path.

The stator pole pieces form part of a means for providing a rotating magnetic field in the region of the rotor. The rotating magnetic field can be provided, for example, by a rotating magnet beneath the substrate on which the rotor is mounted, or by an external magnet which couples a magnetic flux to the stator pole pieces in a time varying manner to create the rotating magnetic field. In a preferred embodiment, the electrical excitation to provide the magnetic field in the pole pieces is provided by conductors formed integrally on the substrate with the stator pole pieces. Such conductors may be formed as conductive strips surrounding upstanding stator pole pieces or as adjacent conductors formed on the substrate which provide a current which encircles the pole piece to induce a magnetic flux therein. By providing perpendicular pairs of pole pieces, each excited by sinusoidal currents, 90° out of phase with the other, rotating magnetic fields can be generated in the rotor region which will drive the rotor to rotate with the magnetic field.

Utilization of a sacrificial layer in conjunction with the LIGA process allows the rotor to be formed of a ferromagnetic metal such as nickel at substantial vertical dimensions, e.g., a hundred microns or more, which allows formation of stable structures which can be handled and assembled into place. Additional gears can also be formed by the sacrificial layer process which can be engaged to the rotor, such as by having gear teeth on the periphery of the rotor engage the gear teeth of the gears. The gears can thereby be utilized to provide power transfer to other mechanically driven devices.

Further objects, features and advantages of the invention will be apparent from the following detailed description when taken in conjunction with the accompanying drawings.

DETAILED DESCRIPTION OF THE INVENTION

The sacrificial layer LIGA process utilized in the present invention is illustrated in FIGS. 1–7 and is described below with reference to these figures.

LIGA processing involves maximum temperatures of 180° C. or so. This property makes material selection for the sacrificial layer or layers quite easy because many material candidates exist. The requirements are simply that the sacrificial material can be applied with good adhesion, that it can be locally defined, and that it can be covered with a plating base without flank coverage problems. In addition, X-ray damage must be minimized and removal via surface micromachining or lateral etching must not modify the plated metal. Reasonable systems for plated nickel are polysilicon with hydrazinc as an etch or various double metal combinations. A very convenient sacrificial layer is a spin coated polyimide film which remains soluble in bases for bake-out temperatures to 270° C. or so. This film can be covered by a positive photoresist which enables pattern transfer from an optical mask to the photoresist. Since the developer for positive resist is basic, pattern transfer to the polyimide is achieved via dissolution in the exposed section of the substrate. A heat cycle follows which renders the polyimide mildly soluble in bases and therefore can be followed by a second or third sacrificial layer with a different polyimide thickness.

Figure 1:
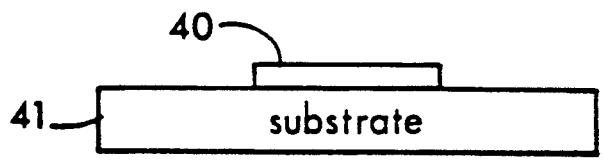
FIG. 1 is a simplified cross-sectional view of an initial processing step in accordance with the present invention wherein a sacrificial layer is formed on a substrate.
Figure 2:
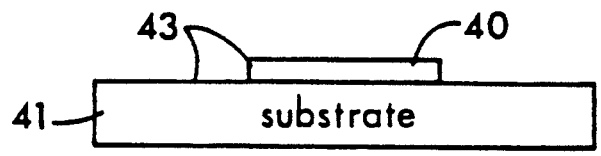
FIG. 2 shows the structure of FIG. 1 with the addition of a plating base.
Figure 3:
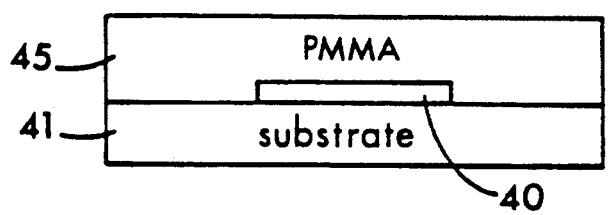
FIG. 3 shows the structure of FIG. 2 with the addition of a layer of PMMA photoresist.
Figure 4:
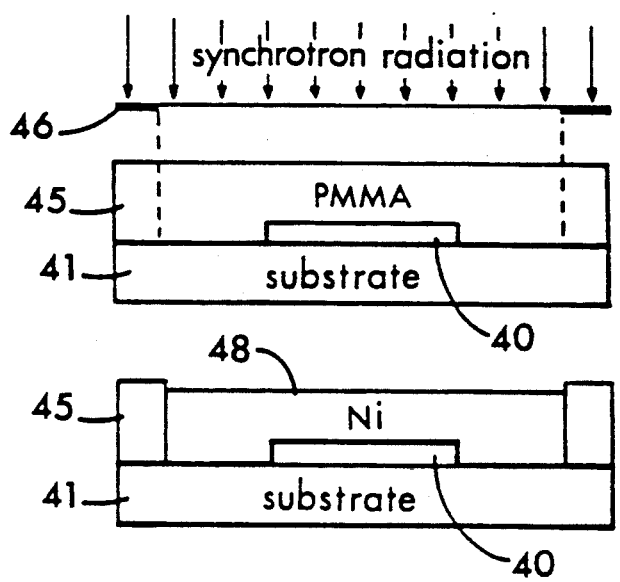
FIG. 4 shows the structure of FIG. 3 being exposed to X-rays through an X-ray mask.
Figure 5:
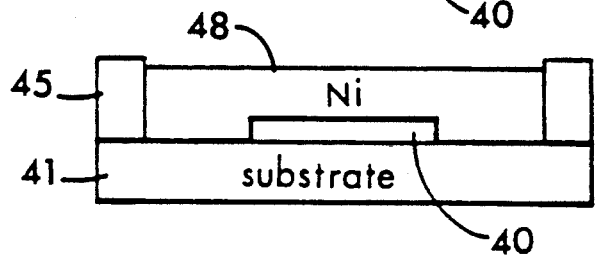
FIG. 5 shows the structure of FIG. 4 after developing and electroplating of nickel into the area of the developed PMMA.

The patterned sacrificial layer, shown at 40 in FIG. 1 on the top surface of a substrate 41, is covered by the plating base 43 as shown in FIG. 2. Where nickel is to be plated, a satisfactory plating base is a sputtered film which consists of 150Å of titanium followed by 150Å of nickel. This film cannot be patterned in normal situations because electronic contact to the plating fluid has to be established. The prepared substrate is next subjected to the basic LIGA procedure: thick PMMA photoresist application to form a layer 45 as shown in FIG. 3, exposure through an X-ray mask 46 as shown in FIG. 4, developing of the PMMA and electroplating to form the nickel part 48 as shown in FIG. 5. However, there is a severe technical problem: the X-ray mask is geometrically related to the patterned sacrificial layer and therefore must be aligned to the processed substrate. The alignment requirement is complicated by the fact that the exposure source is physically separate from the alignment tools. In a preferred procedure, alignment is followed by the use of a clamping mechanism which can be removed from the alignment tool and allows transport and insertion into the X-ray source without mask to substrate slippage. The actual alignment can be accomplished by using optical techniques in a double-sided mask aligner which can accommodate the alignment-clamping fixture. Optical alignment becomes less complicated if the X-ray mask is totally or locally optically transparent. This can be accomplished more directly if the X-ray mask blank is formed from strain controlled silicon nitride. The absorber is a patterned layer of gold which is supplied by additive processing, e.g., by electroplating, and therefore has the desired edge acuity which is difficult to obtain with subtractive processing, e.g., etching, for absorber thicknesses near 4 microns. Mask blanks made from other materials, such as fine grained polysilicon, can also be used but must have locally transparent regions for the present alignment scheme which leads to more complicated mask fabrication procedures.

Figure 6:
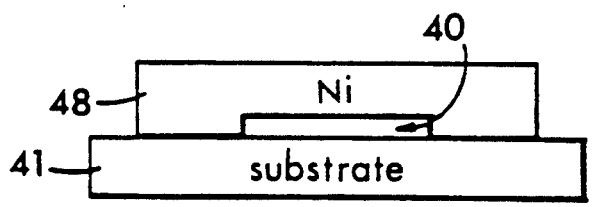
FIG. 6 shows the structure of FIG. 5 after removal of the PMMA.
Figure 7:
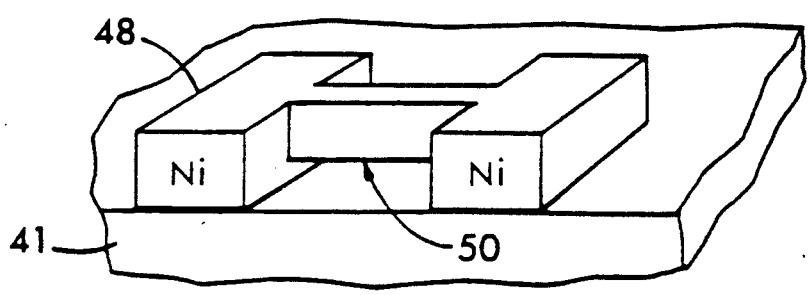
FIG. 7 is a perspective view of the remaining nickel structure on the substrate after removal of the PMMA and the sacrificial layer.

The processing continues with the removal of the used PMMA to leave the isolated structure 48 as shown in cross-section in FIG. 6. This can be accomplished by re-exposure and a second developing cycle or by suitable plasma etching. The unwanted sections of the plating base are removed by wet etching and the exposed sacrificial layer is dissolved in ammonium hydroxide to form the finished structure. As illustrated in FIG. 7, this structure has a cavity 50 where the sacrificial layer 40 was located, and allows the structure 48 to be completely removed from the substrate 41 if the sacrificial layer is formed under the entire structure.

The sacrificial layer LIGA process can be applied to create a variety of microstructures formed of metal which have previously been formed of silicon via silicon micromachining. Generally, the sacrificial layer LIGA process allows simpler processing with typical mask level reductions from six or eight to two, and very high aspect ratio structures which scale directly into higher force outputs for actuators. Moreover the process can be used with any planar substrate to which the sacrificial layer and the plating base can be attached. Therefore, typical silicon substrates are acceptable, but so are quartz, sapphire, glass, plastic, and metal substrates.

Nickel and several of its alloys are ferromagnetic. They exhibit high permeabilities (low reluctance) for low flux densities and saturate at high magnetic fields of 10,000 gauss or so. At 3 micron working gaps and $1 \times 10^5$ volt/cm electric fields, magnetic fields of 10,000 gauss produce roughly three orders of magnitude larger gap pressures than can be obtained with electrostatic fields.

Magnetic fields are established by currents. The driving point impedance for single turn excitation conductors typically involves one or two ohms of DC resistance and inductance in the few nanohenry range. Current drive to 200 milliamperes will therefore involve voltage drops below a full volt. Bipolar rather than CMOS circuitry can achieve this easily and is nearly a perfect match for micromagnetics.

Figure 8:
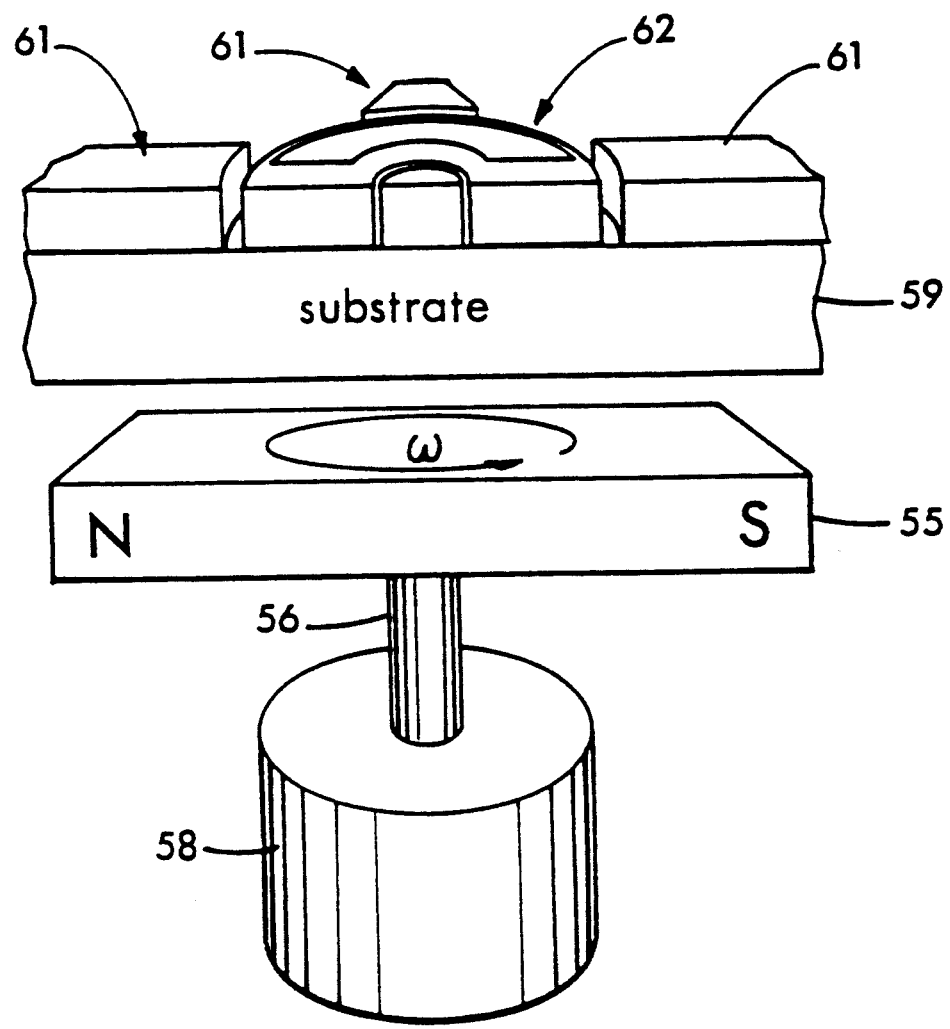
FIG. 8 is a simplified perspective view of a micromechanical device having a rotating rotor which is driven by a magnet rotating beneath the substrate on which the rotor is mounted.

An exemplary magnetically actuated micro-device is illustrated in FIG. 8. A permanent magnet 55 mounted for rotation on the shaft 58 of a motor 58 is located beneath the backside of a substrate 59 and its field is coupled through stator poles 61 to a rotating rotor 62 on the substrate surface. Rotation of the magnet 55 beneath the stator, or equivalently, two phase excitation by an electromagnet of the stator, produces a rotating magnetic field which drives rotation of the rotor 62. This field can be increased by bringing the magnetic excitation closer to the actuator. Most importantly, the minimum magnetic field which causes rotation can be measured by a suitable gauss meter. Such 100 micron structures are found to rotate quite satisfactorily at magnetic field strengths of 6 gauss or so. This is only about one order of magnitude above the earth's magnetic field.

Figure 9:
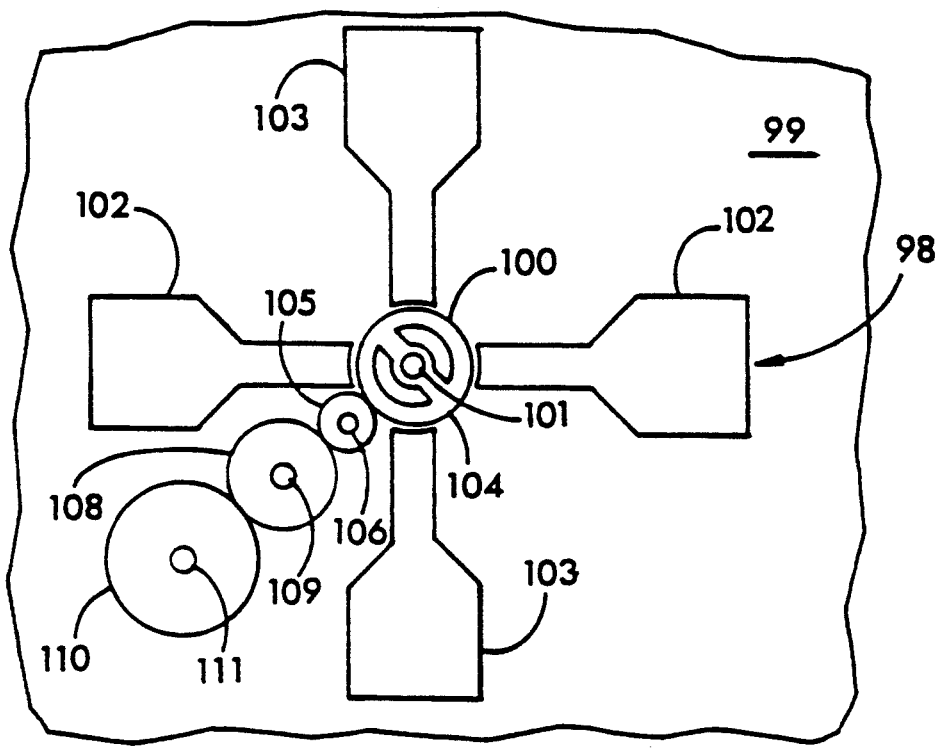
FIG. 9 is a plan view of a micromechanical motor in accordance with the present invention formed on a substrate.
Figure 10:
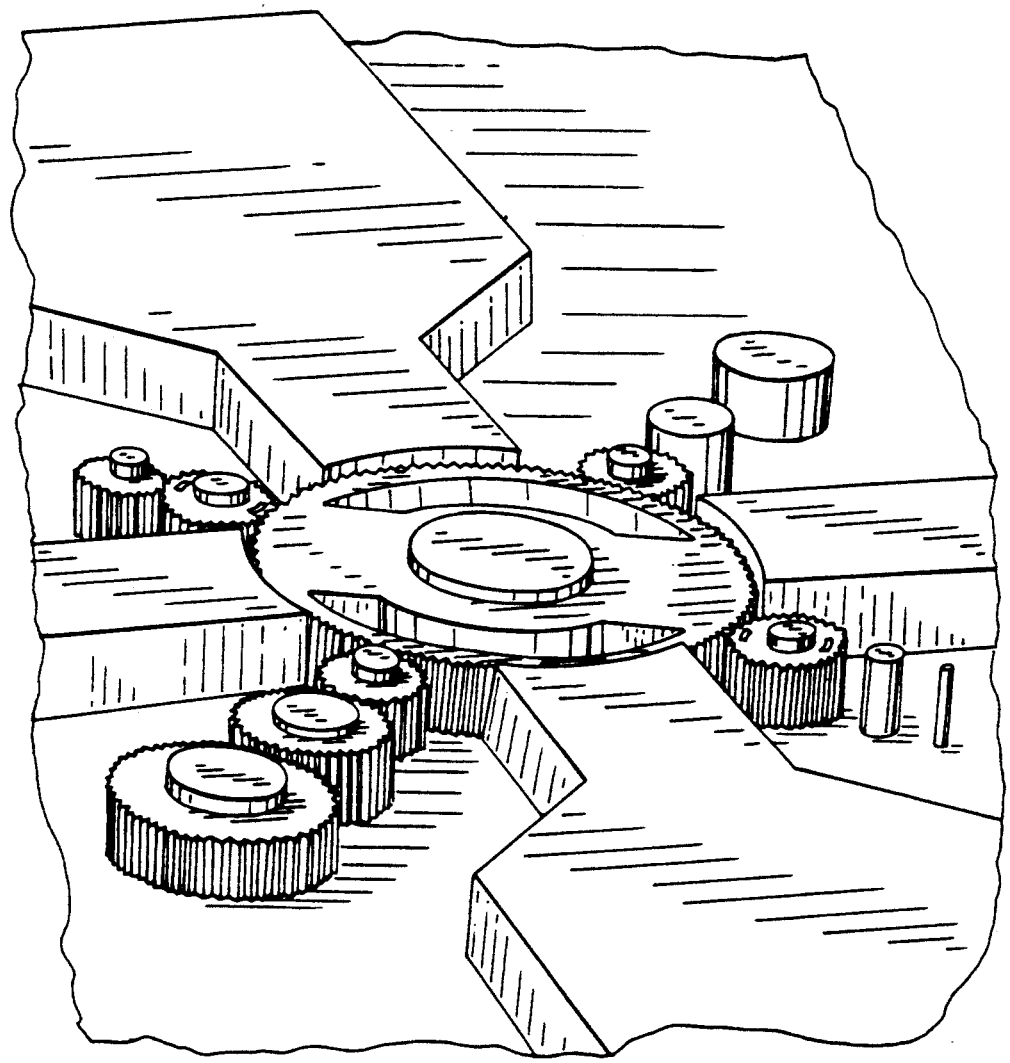
FIG. 10 is a photomicrograph of a micromechanical motor of the type shown in FIG. 9.
Figure 12:
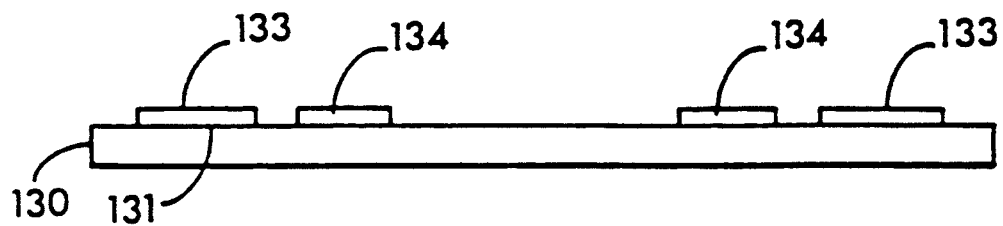
FIG. 12 is a cross-sectional view of a first step in a process for the formation of a magnetic micromotor.
Figure 13:
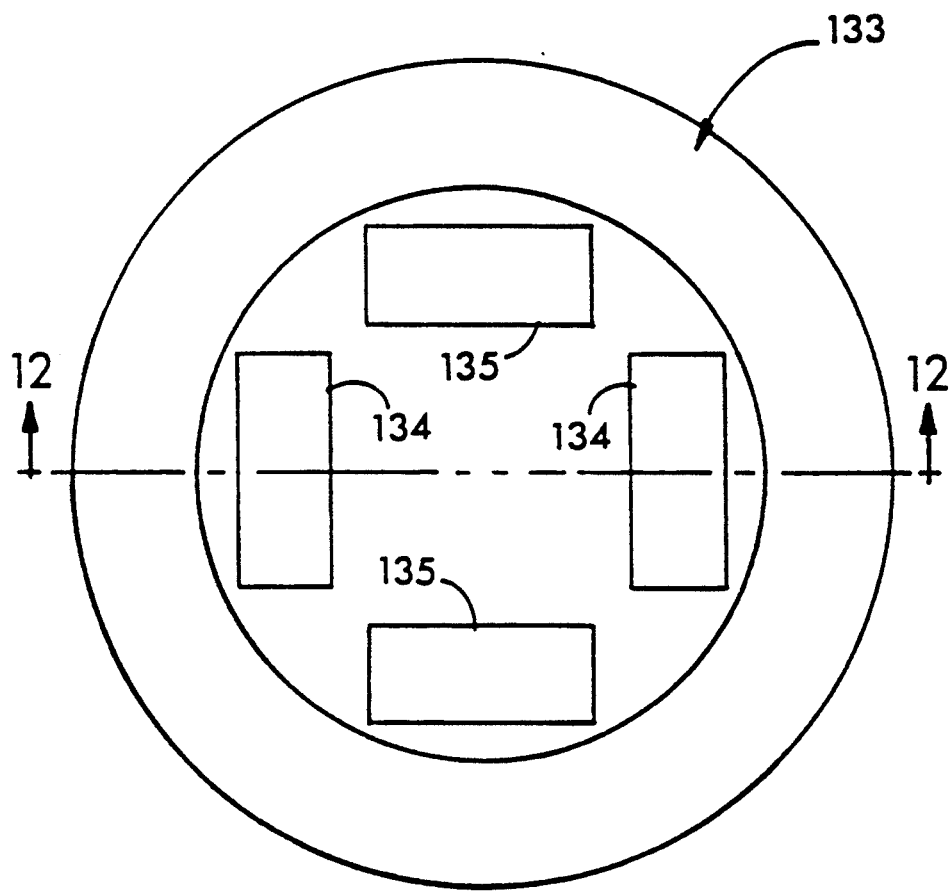
FIG. 13 is a plan view of the structure shown in FIG. 12.
Figure 14:
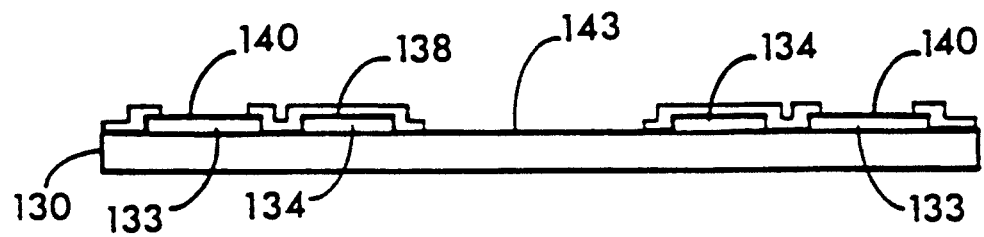
FIG. 14 is a cross-sectional view of the structure of FIG. 12 after further step of processing.
Figure 15:
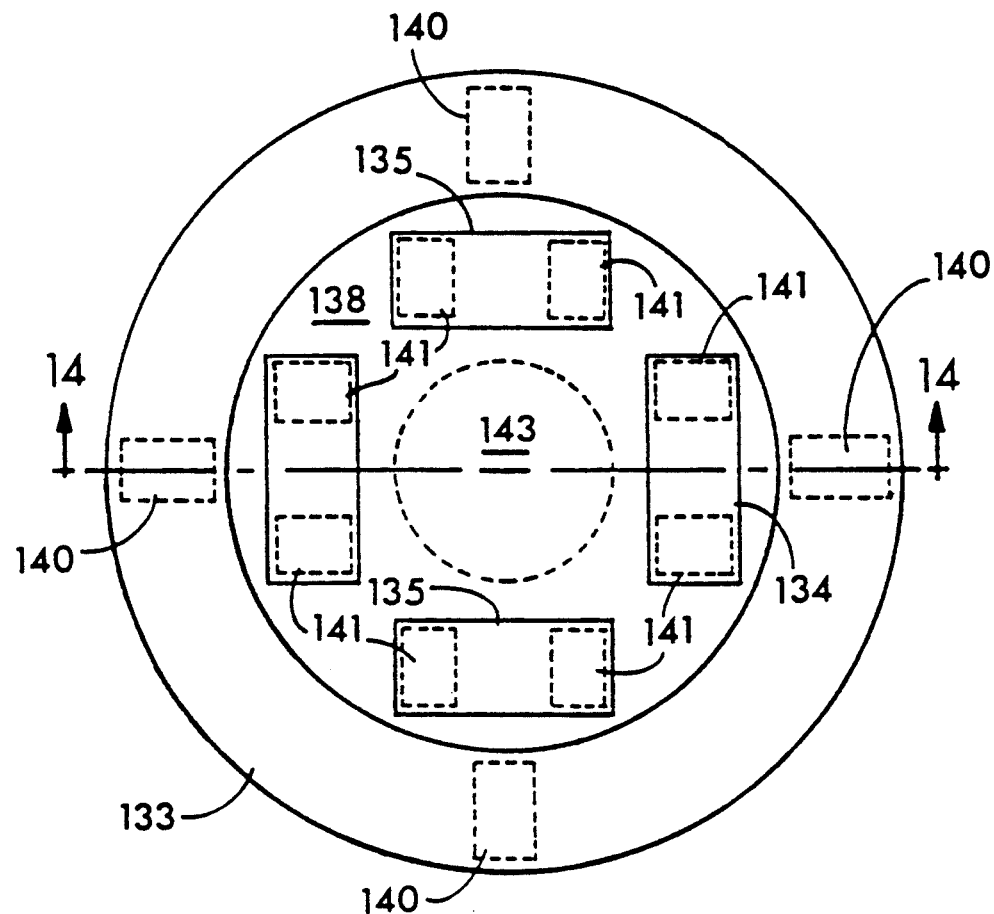
FIG. 15 is a plan view of the structure of FIG. 14.
Figure 16:
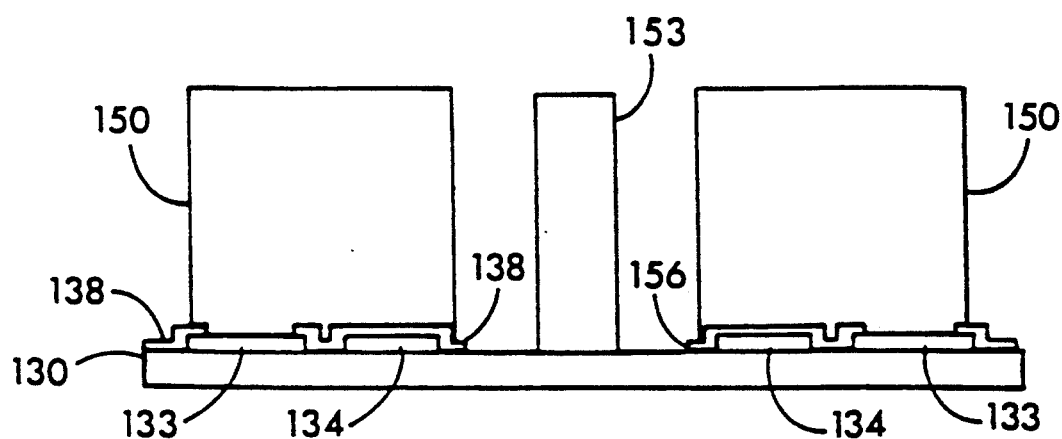
FIG. 16 is a cross-sectional view of the structure of FIG. 14 after further processing.
Figure 17:
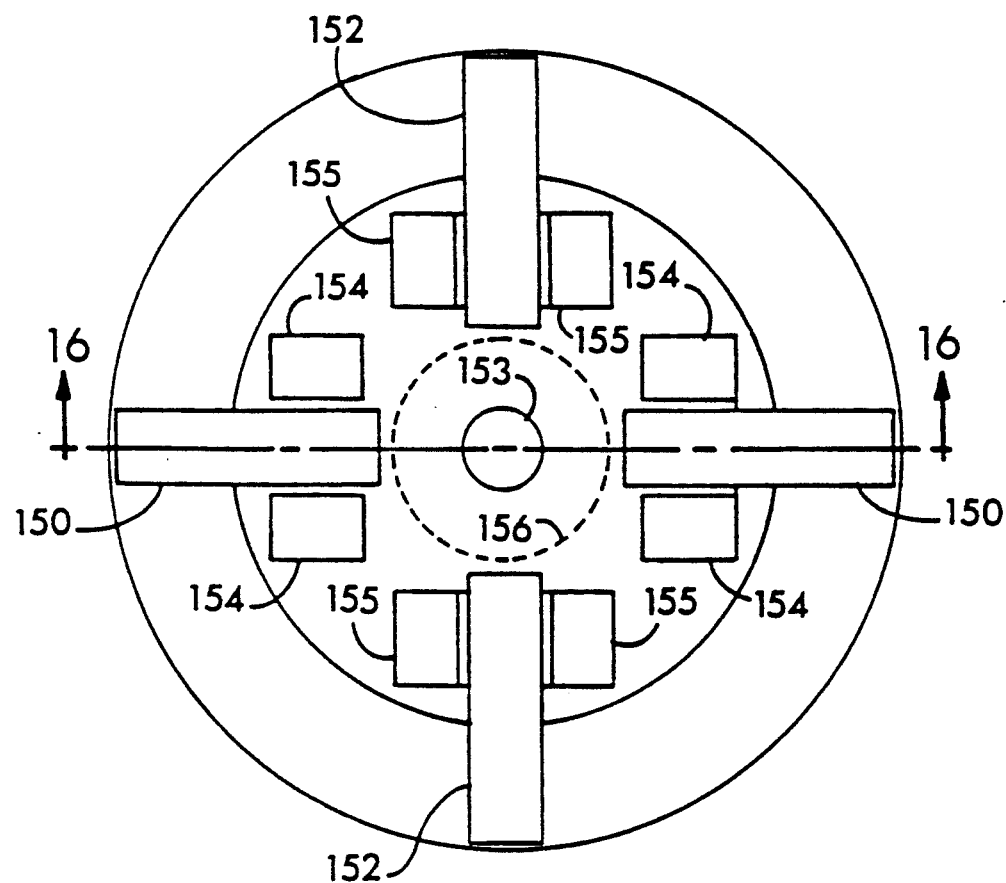
FIG. 17 is a plan view of the structure of FIG. 16.

A basic magnetic micro-motor 98 is shown in plan view in FIG. 9, and FIG. 10 is a photomicrograph of the completed structure. The micromotor 98' is formed on a substrate 99 and has a rotor 100 rotatable about a post 101 which acts as the hub for the rotor. The motor includes two sets of stator pole pieces 102 and 103 arranged perpendicular to each other to allow two phase driving of the rotor 100. The rotor 100 has a peripheral ring with an outer surface with gear teeth 104 thereon which mesh with the teeth of a gear 105, and rotates about a shaft 106. A gear 108 rotating about a shaft 109 is engaged to the gear 105, and a gear 110 rotating about a shaft 111 is engaged to the gear 108. Power may thus be taken off the train of gears 105, 108, and 110 by other mechanical devices (not shown) to accomplish desired mechanical tasks.

Figure 11:
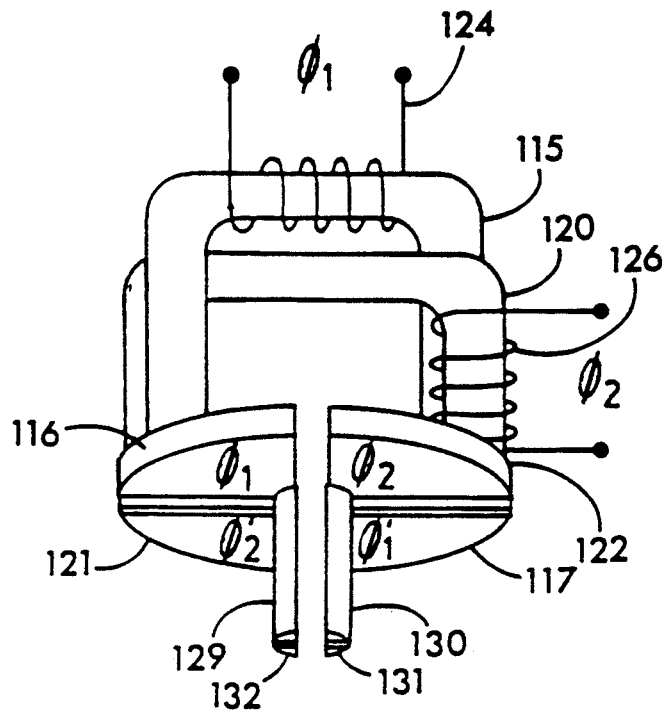
FIG. 11 is a perspective view of an exemplary magnetic field generator which can be coupled to the micromotor of FIG. 9 to drive the rotor of the same.

In addition to being driven by an external rotating magnet, the rotor 100 can also be driven by applying a time varying magnetic field between the stator pole pieces 102 and 103. An example of an external device which can be utilized to couple a time varying magnetic flux to the stator pole pieces 102 and 103 is shown in FIG. 11. This structure utilizes two magnetic metal core pieces for providing a quadrature flux paths. The first core piece includes a U-shaped bar 115 of ferromagnetic material such as nickel which is engaged to quarter pieces 116 and 117, and a second U-shaped magnetic bar 120 which is engaged to quarter pieces 121 and 122. A first phase winding 124 is wound around the bar 115 and a second phase winding 126 is wound around the bar 120. Extending from the bottom of the quarter pieces 116, 117, 121 and 122 are four elongated quarter pieces 129-133 each of which is joined to the bottom of one of the quarter pieces 116, 117, 121 and 122. The bars and quarter pieces function as flux guides and are also formed of ferromagnetic material such as nickel. Thus, when the first phase winding 124 is provided with current, a magnetic flux path exists between the ends of the quarter pieces 129 and 131, and when a current is passed through the second phase winding 126, a magnetic flux path is formed between the ends of the quarter pieces 130 and 132. The free ends of the quarter pieces 129-132 are adapted to engage with the top of the widened portions of the four stator pole structures 102 and 103 so that, for example, a current passed through the first phase winding 124 will provide a flux path between the stator pole pieces 102 through the rotor, whereas current passed through the coil 126 will provide a magnetic flux path between the stator pole pieces 103 through the rotor 100. By providing sinusoidally varying currents to the two coils 124 and 126 that are 90° out of phase, a resultant magnetic field is generated in the region of the rotor that rotates around the axis of the rotor. It is noted that providing magnetic flux in this manner allows the rotor to be driven without an electrical connection to the substrate 98 on which the rotor is mounted.

The rotor may be one which is permanently magnetized along its way (low reluctance) axis. This will increase the maximum torque which can be produced. In such a case, the rotor material should be preferably be magnetically bard (i.e., have a square B-H loop) with high coercivity. This may be accomplished be electroplating an alloy of nickel with high coercivity (e.g., nickel-cobalt) and by using approximate anneal cycles. The electroplated part may be magnetized during electroplating or after release from the substrate in a sufficiently intense magnetic field.

Since ferromagnetic materials like nickel exhibit hysteresis, the rotor may be non-solvent (have no variation in reluctance along any direction of its axis) and have torque generated by the alternating or rotating hysteresis losses which will occur when the rotor is subjected to a rotating magnetic field.

Figure 35:
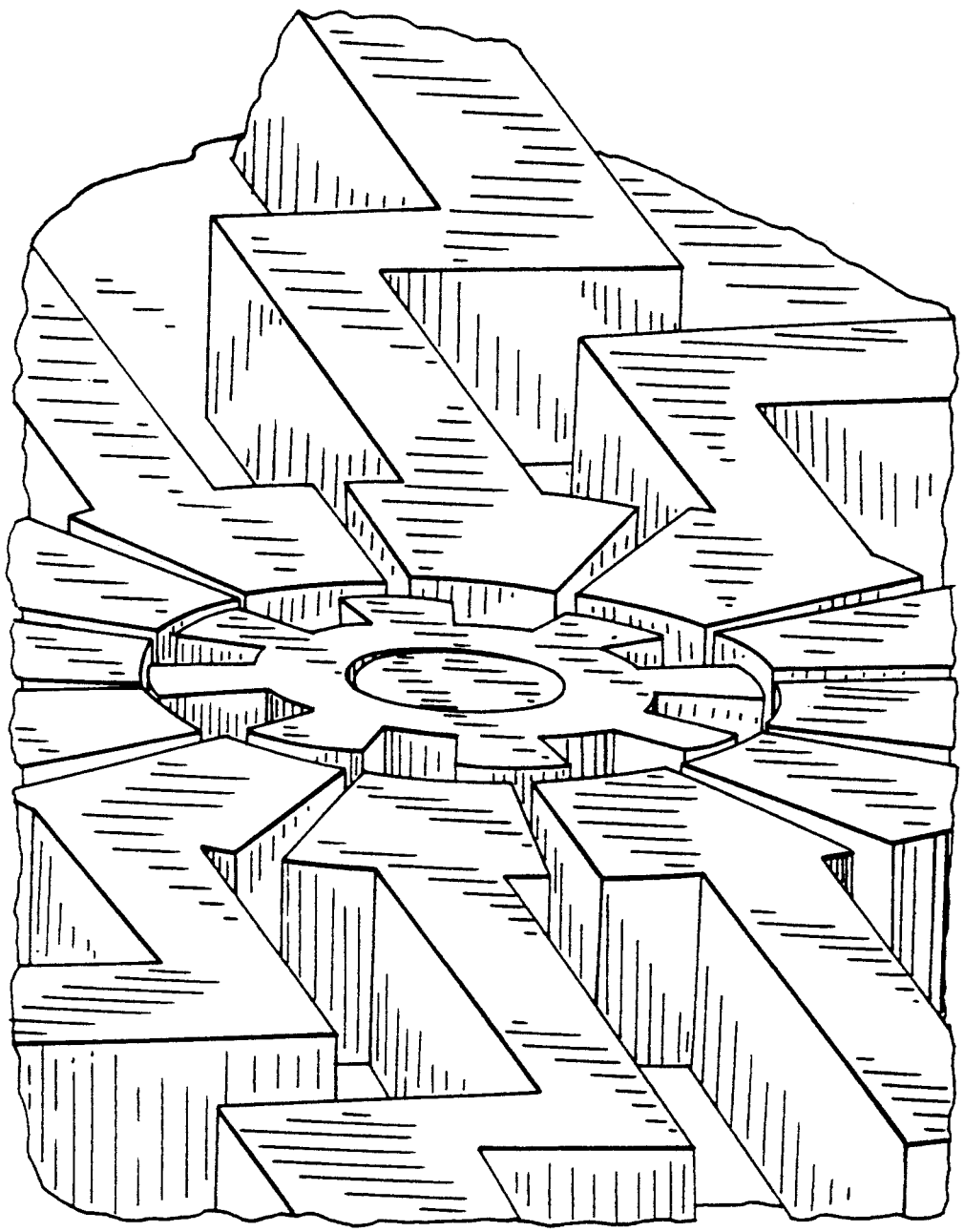
FIG. 35 is a photomicrograph of another rotor and stator structure in accordance with the inventors.
Figure 36:
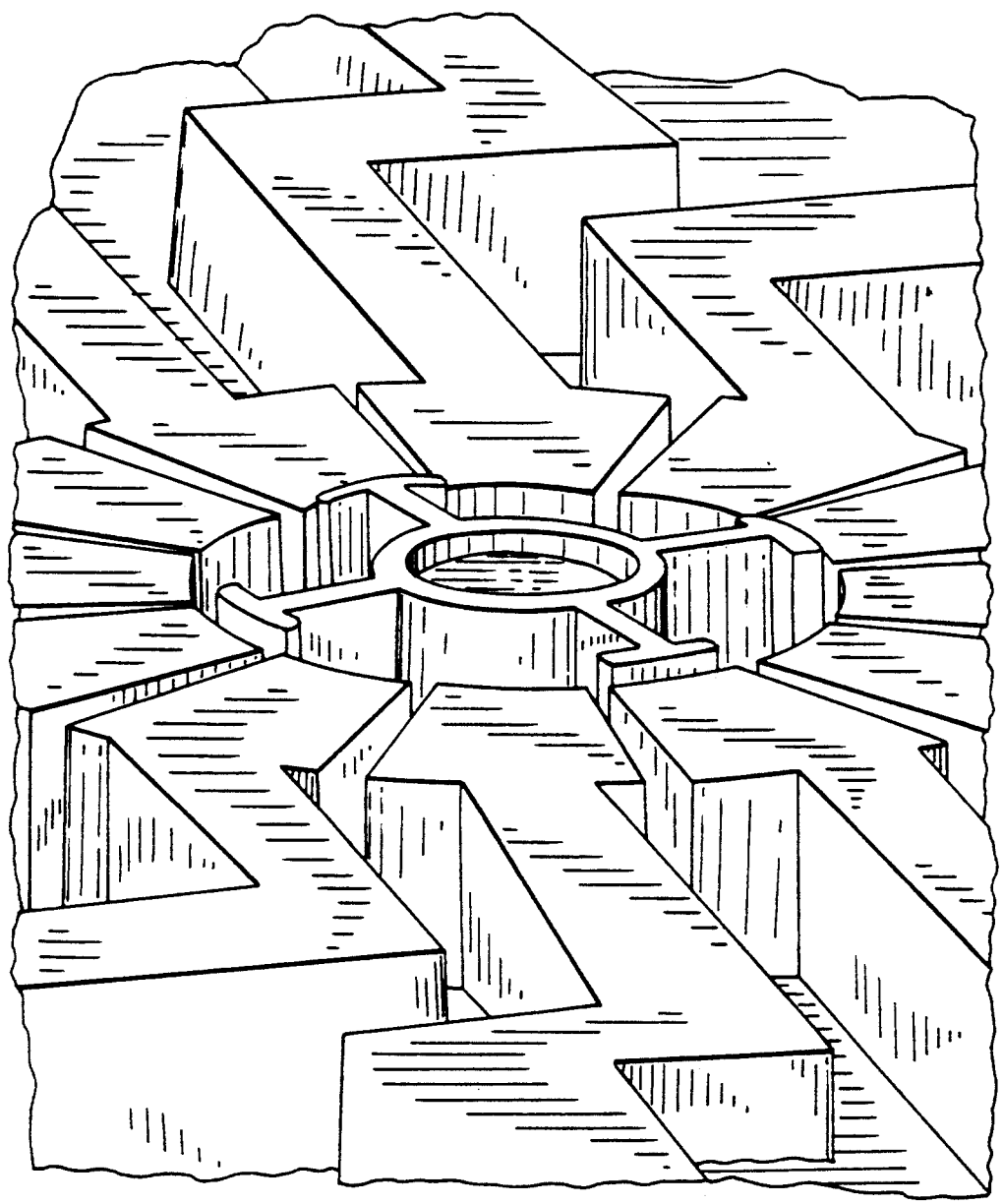
FIG. 36 is a photomicrograph of an assembled stepping motor in accordance with the invention.
Figure 37:
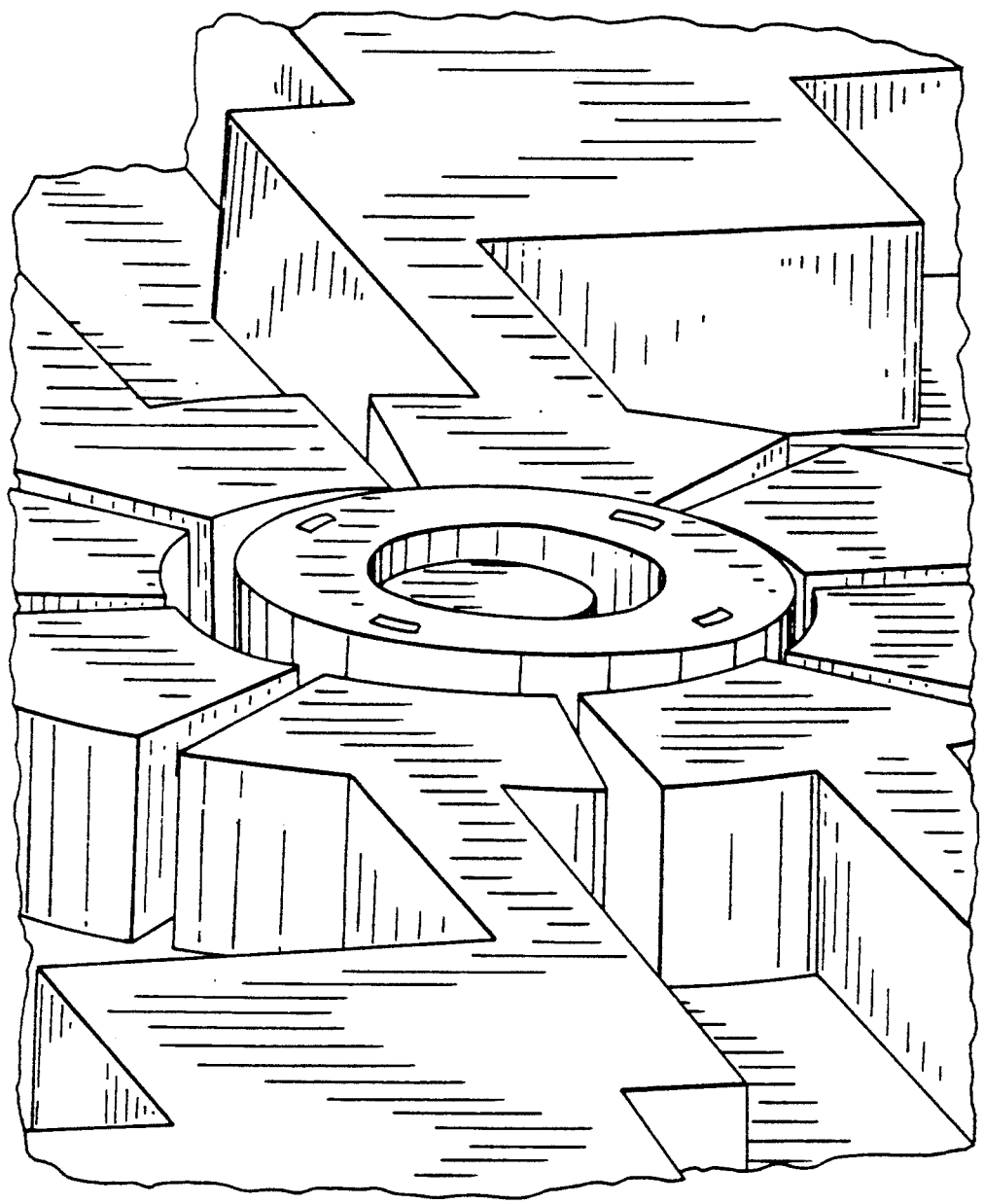
FIG. 37 is a photomicrograph of an assembled wobble motor in accordance with the invention.

FIG. 35 shows an alternative rotor construction in which the rotor has multiple poles formed as spokes or gear teeth, and thus has multiple low and high reluctance paths therethrough. FIG. 36 shows another spoke-like rotor construction which can be operated as a stepping motor. FIG. 37 shows a round rotor having an internal opening larger than the hub so that the rotor rotates eccentrically and functions as a wobble rotor.

The construction of a motor in which the electrical excitation is integrated on the substrate with the stator is shown in FIGS. 12-19. With reference to these figures, the construction can be briefly described as follows. First, a plating base of titanium (about 150 Angstroms) and nickel (about 150 Angstroms) is sputtered onto a substrate 130, which may be of any relatively, flat, polished, clean material, such as single crystal silicon, quartz, sapphire, glass, or comparable substrate materials. Linear PMMA is then spun onto the plating base 131 to a thickness of about 6 μm and the PMMA is then patterned optically (X-ray lithography is not necessary because of the relatively thin layer of PMMA which is being patterned) and nickel is electroplated to about 5 μm. The PMMA and the plating base in the areas other than underneath the nickel is then removed. This leaves the structure as shown in cross-section in FIG. 12, and in plan view in FIG. 13, in which there is a ring shaped magnetic flux return path 133 formed of nickel and four nickel pads 134 and 135 for the two phases of the stator.

The polyimide isolation layer is then spun on to roughly 3 μm thickness and soft annealed. The isolation layer is then patterned to open up stator anchors and contacts to current carrying lines, and a plating base of titanium and nickel is described as before is then sputtered onto the overall structure. The structure at this point is illustrated in cross-section in FIG. 14, and in elevation in FIG. 15, in which the polyimide isolation layer 138 overlays the other structures except for openings 140 for stator contacts and openings 141 for conductive wire connections to the stator electrical conductors.

PMMA is then cast to the desired thickness of the major structures, e.g., 100 microns or more, and the X-ray mask is then aligned to the PMMA which defines the stator, hub and winding leads. Synchrotron X-ray exposure is then carried out, with developing of the PMMA to leave the desired cavities, and then nickel is electroplated to the desired thickness. The remaining PMMA is then removed, leaving structures as illustrated in cross-section in FIG. 16 and in plan view in FIG. 17. These include stator pole pieces 150 for a first phase and pole pieces 152 for a second phase, formed of the electroplated nickel, which are mounted to the substrate by contact with the plating base at the exposed portions of the magnetic flux return ring 133, and a central hub 153. Both of these structures are relatively high, e.g., in the range of a 100 μm. Note that the polyimide release layer 138 is left extending outwardly from the stator pole pieces 150 and 152 to an inner peripheral wall 156. Current contacts 154 and 155 are formed of nickel for proving a current path connection to the conductors 134 and 135 which underlie the stator pieces 150 and 152.

Figure 18:
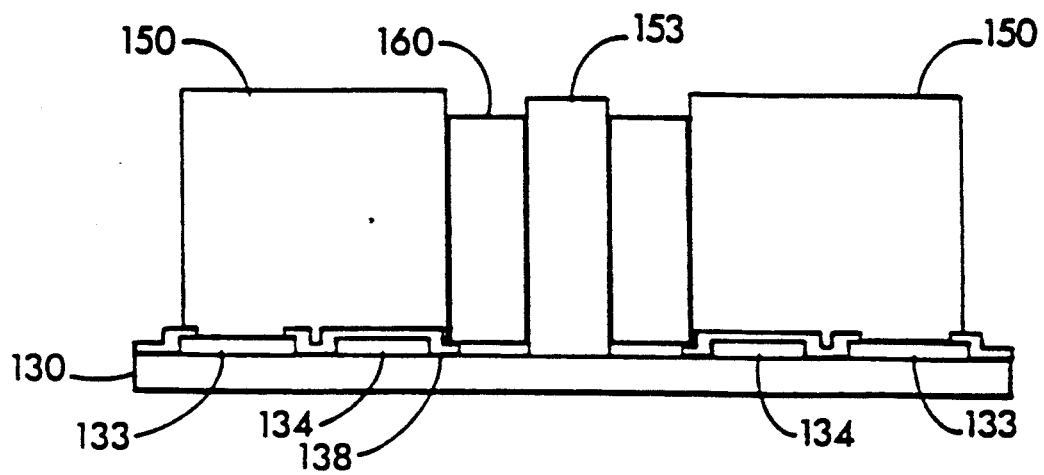
FIG. 18 is a cross-sectional view of the structure of FIG. 16 after assembly of a rotor onto the structure.
Figure 19:
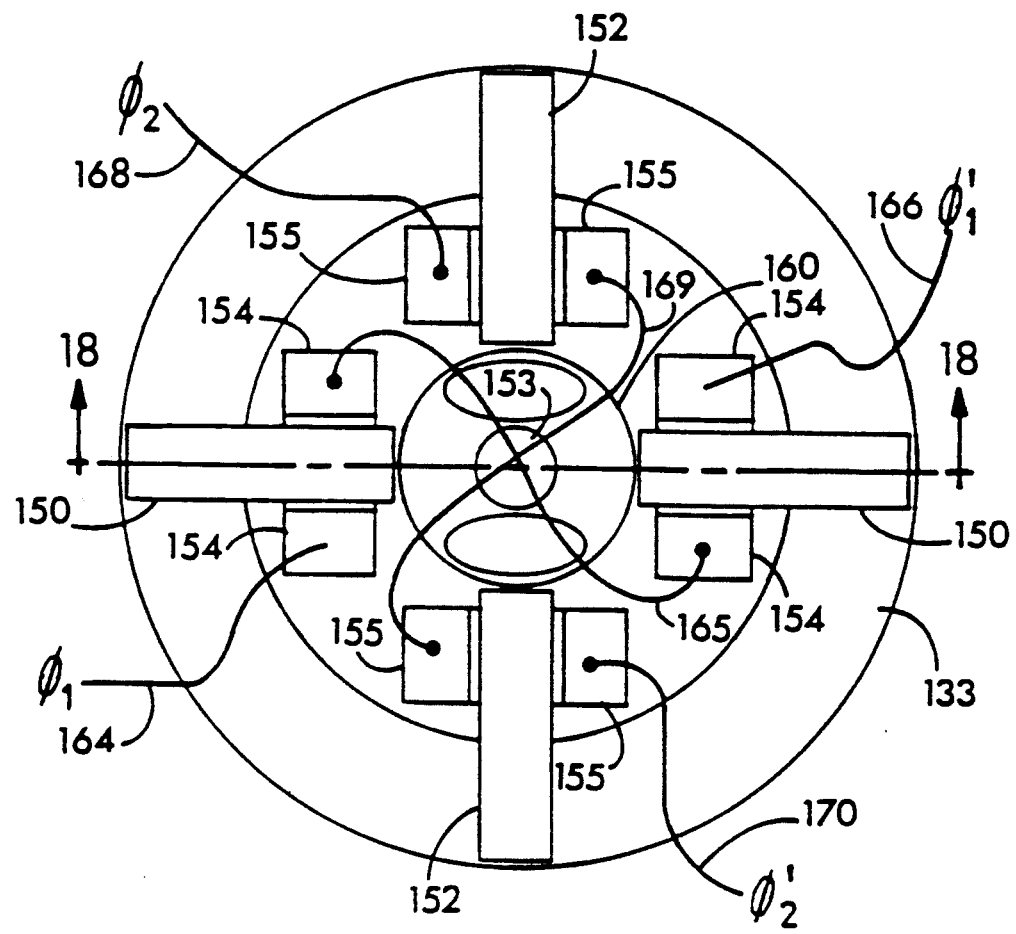
FIG. 19 is a plan view of the structure of FIG. 18.

The final step, as shown in FIGS. 18 and 19, is the addition of a rotor 160 which fits over the hub 153 between the pole pieces 150 and 152 and which is supported at its edges for rotation by a portion of the polyimide isolation layer 138. Illustrative electrical connections for the phase windings include a first wire 164 for the first phase which connects to one of the pole conductors 154, with the circuit being completed from the other end of the pole conductor through a conductor 165 to the diametrically opposite pole conductor 154, and from the other pole conductor through an electrical lead 166. The second phase connections are provided by a wire 168 connected to one of the conductors 155 for the second phase, from the other end of the conductor 155 by a wire 169 to the diametrically opposite phase conductor 155, and thence completed from the other phase conductor through a wire 170. By applying sinusoidally varying electrical currents to the first phase wires 164, 166 and to the second phase wire 168, 170 which are 90° out of phase with one another, a rotating magnetic field is provided through the rotor to cause the rotor to be driven to follow the field.

The following describes the processing steps for carrying out the construction of the motor structure described above.

FIRST LAYER

Define inter-stator magnetic flux paths and returns for current carrying wires.

1. A plating base of 150 Angstroms of titanium followed by 150 Angstroms of Nickel is sputtered onto the substrate material. This initial step defines the first layer which provides the inter-stator magnetic flux paths and the returns for the current carrying wires.

2. Spin on linear PMMA (KTI PMMA 9% solids, dyed with coumarin 6 in the ratio 25 ml PMMA to 50 mg coumarin 6) to a thickness of 6 μm using an anneal sequence of: 60° C./hr. ramped up to 180° C., hold for one hour, 60° C./hr. ramp down to room temperature, for each layer of PMMA (4 layers of PMMA are necessary at 1.5 μm each when spun at 2 krpm for 30 seconds).

3. Pattern PMMA with a 2-layer photo resist process.
   a) Spin KTI 809 PR on PMMA at 5 krpm,
   b) Prebake at 90° C. for 15 minutes,
   c) Expose the layer of 809 with first layer mask and develop in 1:1 809 developer:water,
   d) Blanket deep UV (230 nm) expose PMMA,
   e) Develop in the following 3 baths for:
   Five minutes in:
      60% vol. 2-(2-butoxy ethoxy) ethanol
      20% vol. Tetrahydro-1-4 oxizin (morpholine)
      5% vol. 2-Aminoethanol (ethanolamine)
      15% vol. distilled, deionized water;
   Twenty minutes in:
      80% vol. 2-(2-butxoyethoxy) ethanol
      20% vol. water.
   Then five minutes in:
      100% water. (All baths are held at 35.0° C.+ or −0.5° C.).

4. Preparation for electro-plating:
   a) O$_2$ plasma descum for 2 minutes. (In Plasma Therm 1440, for example: O$_2$=25 SCCM, pressure=30 mT, power=50 watts).
   b) Treat nickel plating base with 5% HCl for 15 minutes.

5. Electroplate nickel to 5 μm thickness at 50 mA/cm$^2$ in a nickel sulfamate plating bath.

6. Remove PMMA by blanket deep UV exposure and a development cycle as in 3(e) above.

7. Remove plating base: Ni 40 minutes in 5% HCl, 5 minute water rinse; Ti, 2 minutes in 200:1 HF (49% HF), 15 minute water rinse.

SECOND LAYER

Define isolation layer contact areas.

8. Spin on PiRL(I) (polyimide release layer from Brewer Science, Rolla, Mo.) to a thickness of 3 μm and bake at 210° for one minute on a hot plate.

9. Pattern PiRL to open up plating areas for current wires and stator flux paths:
   a) spin Shipley 1400-27 PR on PiRL,
   b) align and pattern contacts to flux paths and current wires in 1400-27 PR layer which carries over to PiRL layer (MF-321 Shipley developer may be used),
   c) remove 1400-27 PR using acetone,
   d) descum with $O_2$ plasma for one minute as in 4(a) above.
   e) the PiRL at this point may be hard baked between 300° C. and 350° C. if it will not be removed at the end of the process (step 19 below).

10. Sputter 150 Angstroms Ti followed by 150 Angstroms Ni.

THIRD LAYER

Deep X-ray lithography defined layer.

11. Cast PMMA typically to about 100–200 μm.

12. Align x-ray mask containing wire definitions and stator definitions to PiRL contact openings.

13. Synchrotron radiation expose the cast PMMA to a dose of 3.5 kJ/cm$^3$ at the bottom of the cast PMMA at 1 Gev beam energy (e.g., such as provided by the Aladin Synchrotron, Stoughton, Wis.).

14. Develop using the same sequence as in 3(e) above wherein the times are about 20 minutes in the first bath, 20 minutes in the second bath, and 5 minutes in the third bath.

15. Prepare the substrate for nickel plating:
   a) $O_2$ plasma descure as in 4(a) above in 15 seconds on/45 seconds off intervals for a total on-time of 2 minutes,
   b) 5% HCl cut for 15 minutes.

16. Nickel electroplate at 50 mA/cm$^2$ in nickel sulfamate bath (plating rate is about 1 μm/minute).

17. Remove cast PMMA via second synchrotron blanket X-ray exposure and development as in Step 14 above.

FOURTH LAYER

Assemble rotor on center hub, the rotor having been processed on a separate substrate and released via an unpatterned PiRL sacrificial layer.

18. Remove plating base:
Ni, 40 minutes in 5% HCl 5 minutes of water rinse,
Ti: 2 minutes in 200:1 HF(49%), 15 minutes of water rinse.

19. (Optional): The PiRL layer may be removed with a suitable basic solution (for example, in 3:1 $H_2O$:$NH_4OH$).

20. Bond out wiring to the individual stators (may be soldered or silver epoxied to nickel windings).

21. Assemble the corresponding rotor on the center post.

It is noted that the current windings could be plated from copper on both the first and third layers by separating the stator and wire patterns into individual masks, and repeating the first and third layer processing using copper (or gold, or any high conducting, non-magnetic electroplated metal). Using nickel for the windings will not result in a substantive change in the performance of the device, although it does have higher resistivity than either copper or gold.

Figure 20:
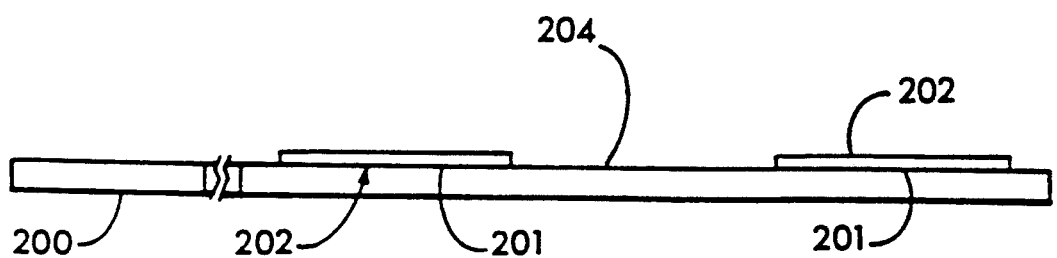
FIG. 20 is a cross-sectional view through a substrate illustrating a first step in another process for forming a magnetic micromotor.
Figure 21:
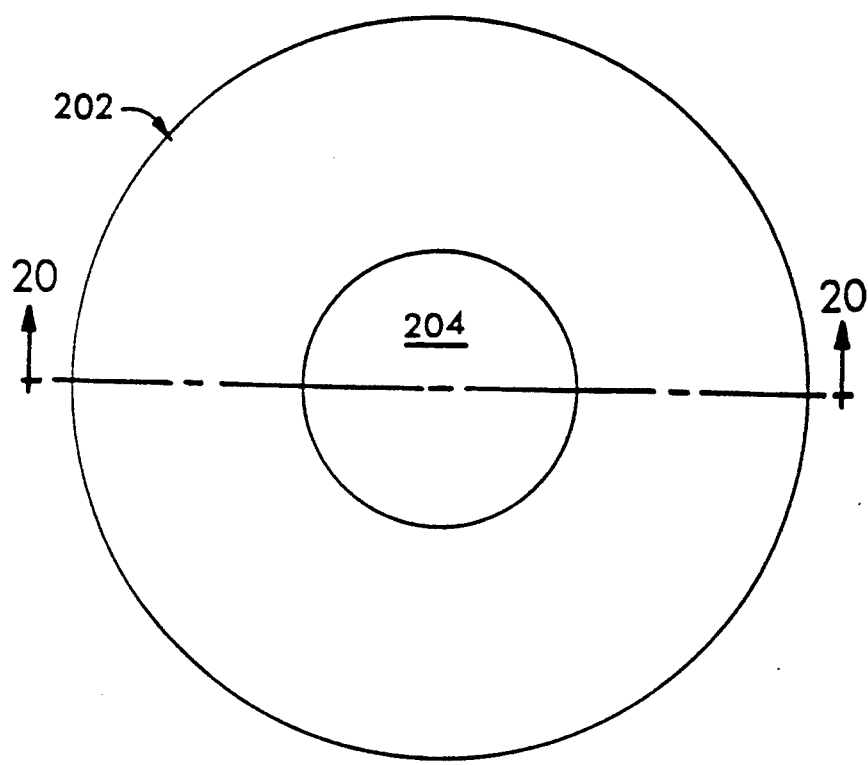
FIG. 21 is a plan view of the structure of FIG. 20.
Figure 33:
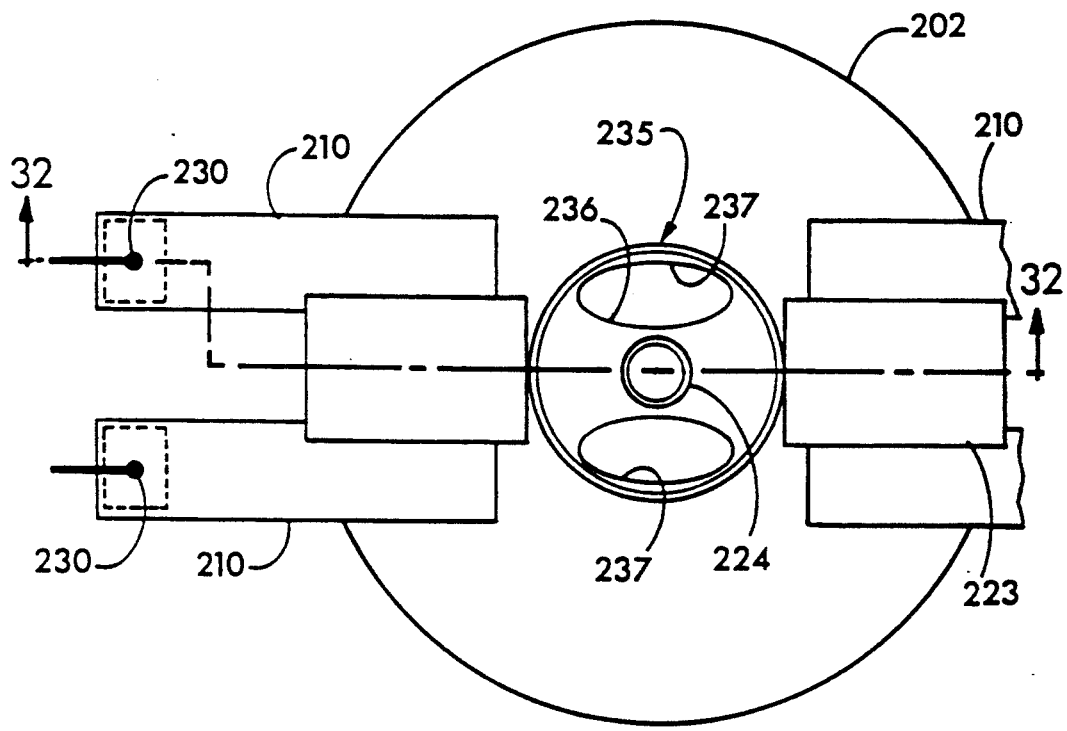
FIG. 33 is a plan view of the structure of FIG. 32.
Figure 34:
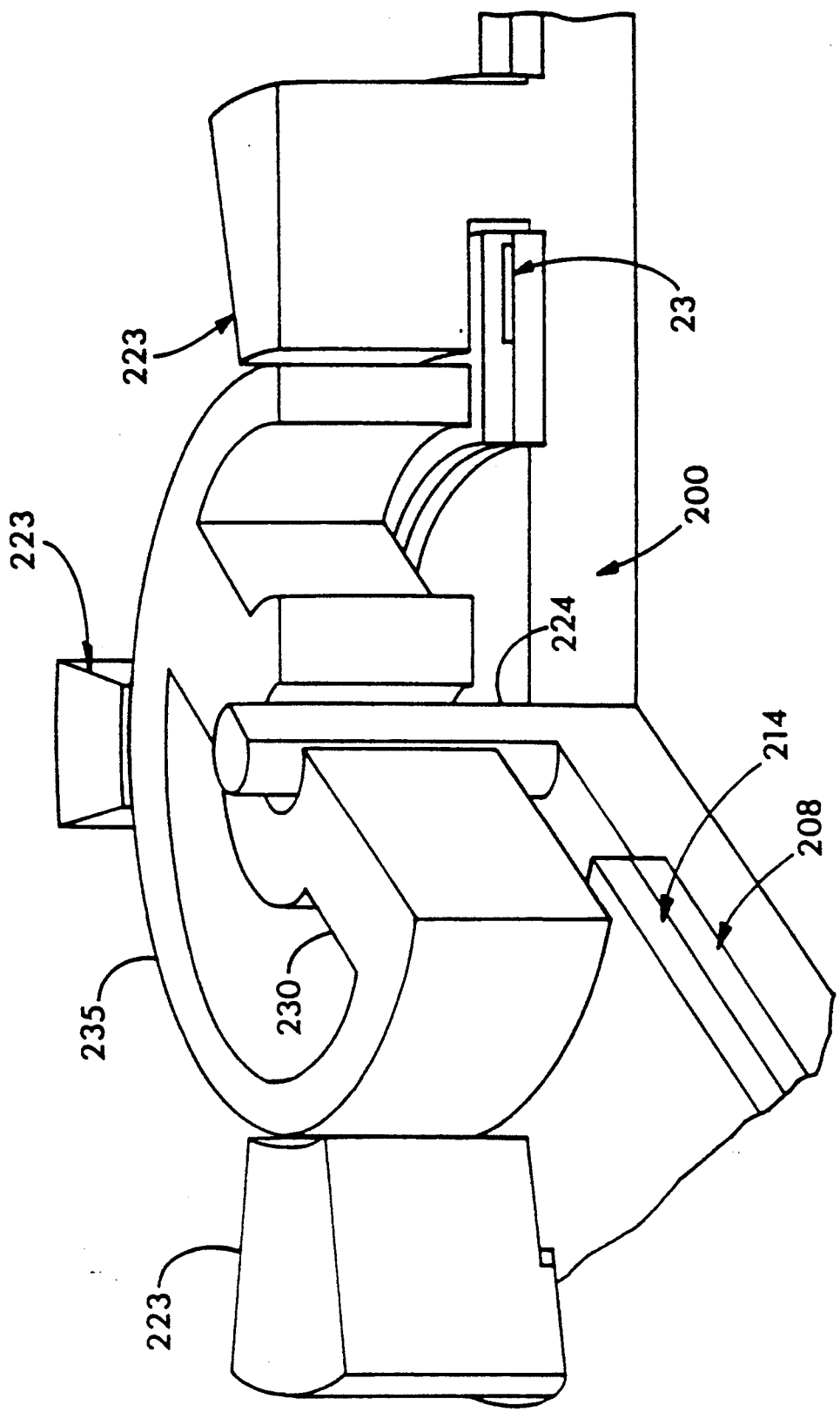
FIG. 34 is a simplified perspective view, partially cut away, of the completed magnetic micromotor of the type illustrated in FIGS. 32 and 33.

The formation of an alternative electrical excitation system for a magnetic micromotor is shown in FIGS. 20–33, and forms the motor structure shown in perspective view in FIG. 34. The basic process can be summarized with reference to these figures, starting with FIGS. 20 and 21. First, a plating base is sputtered onto a starting substrate, for example, glass, and comprises a layer of titanium (about 150 Angstroms) and nickel (about 150 Angstroms) to provide a plating base 201 on the top surface of the substrate 200. Linear PMMA is then spun on in a layer with a thickness of about 6 μm. The PMMA is patterned optically and nickel is electroplated to about 5 μm to form the nickel base layer. The PMMA and the plating base is then removed to leave a nickel flux return path 202 in a ring with a center opening 204.

Figure 22:
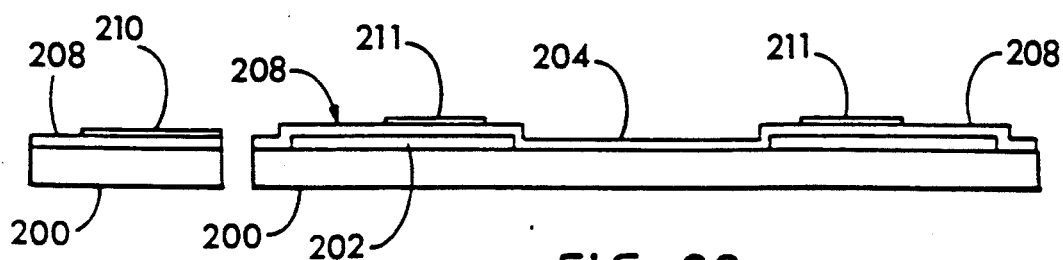
FIG. 22 is a cross-sectional view of the structure of FIG. 20 after a further step of processing.
Figure 23:
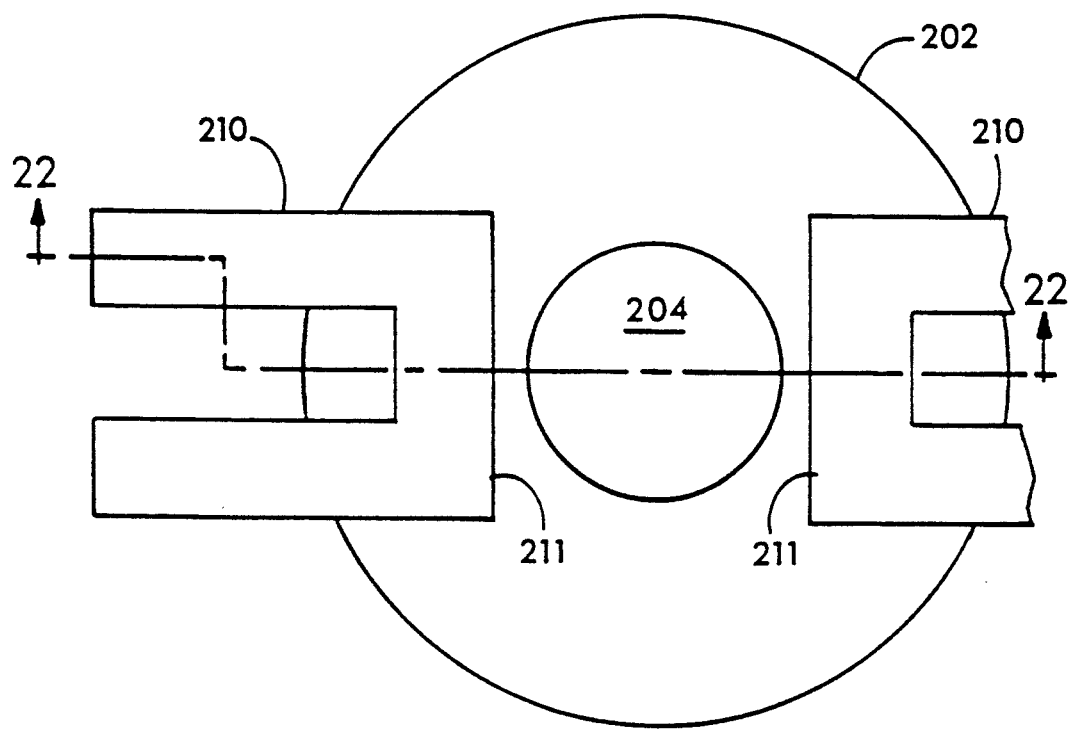
FIG. 23 is the plan view of the structure of FIG. 22.

With respect to FIGS. 22 and 23, a first polyimide (PiRL) layer is spun on roughly to 3 μm thickness and soft annealed to form the layer 208. Aluminum is then sputtered on to about 4 μm and windings are patterned with a P-A-N etch to form the windings 210 which have a general U-shaped with a center bridge section 211.

Figure 24:
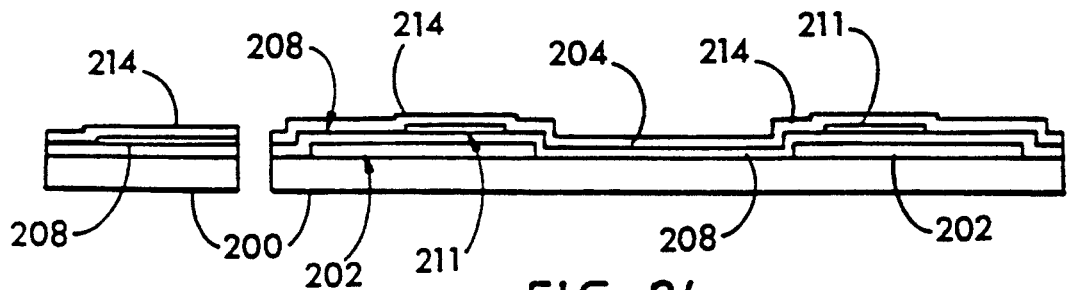
FIG. 24 is a cross-sectional view of the structure of FIG. 22 after further processing.
Figure 25:
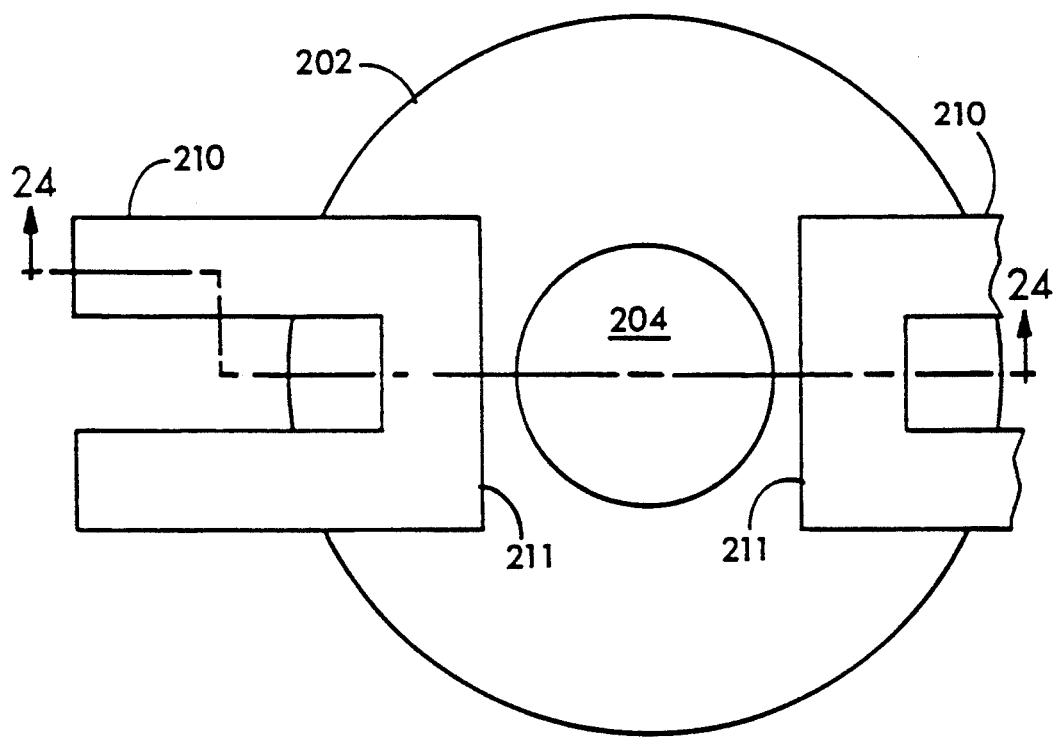
FIG. 25 is a plan view of the structure of FIG. 24.

With reference to FIGS. 24 and 25, a second PiRL isolation layer 214 is then spun on to about 3 microns and soft annealed.

Figure 26:
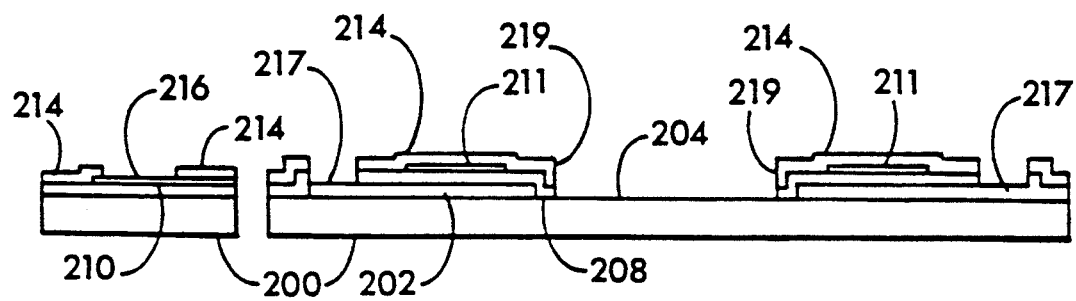
FIG. 26 is a cross-sectional view of the structure of FIG. 24 after further processing.
Figure 27:
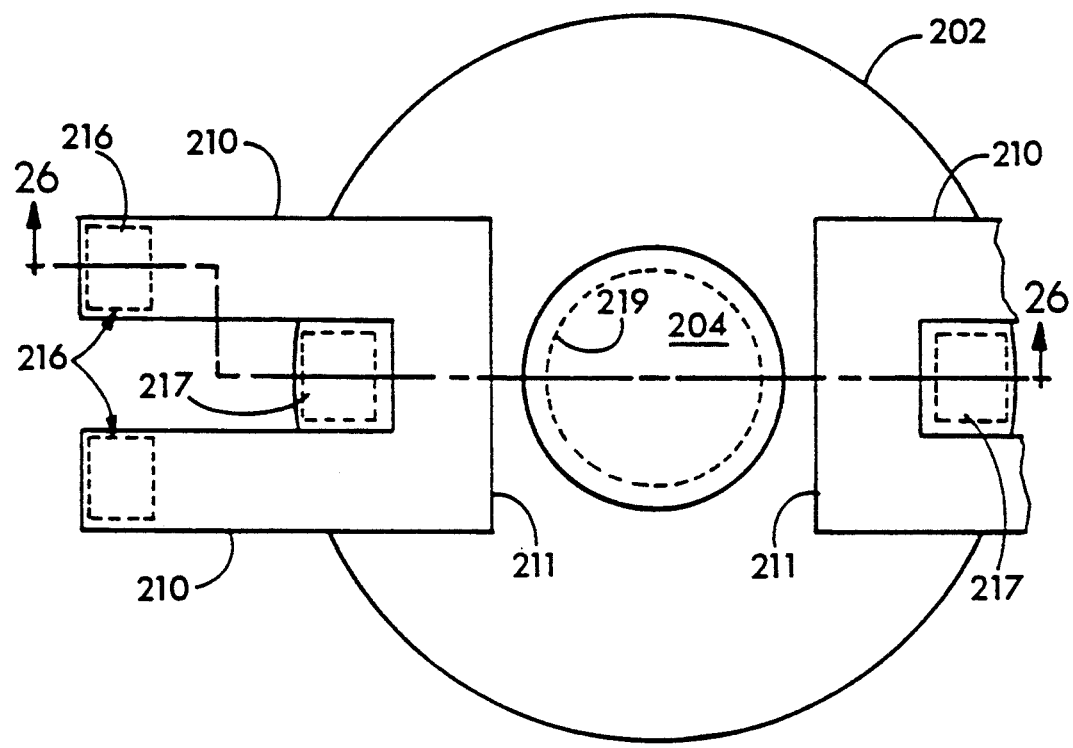
FIG. 27 is a plan view of the structure of FIG. 26.

As shown in FIGS. 26 and 27, vias are then etched in the PiRL for stator anchoring and rotary etch supports, and the remaining PiRL is hard annealed (at about 300° C.). This leaves openings 216 and 217 in the PiRL and an inner wall 219 which surrounds the open area 204. Note that the conductive layer 211 is encased within the PiRL layers 208 and 214.

Figure 28:
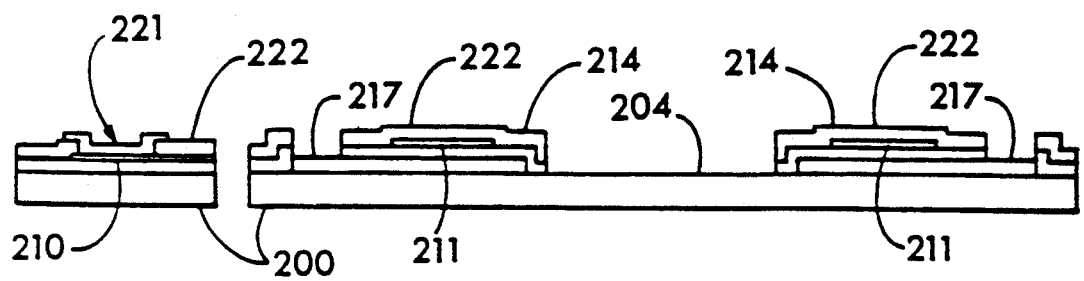
FIG. 28 is a cross-sectional view of the structure of FIG. 26 after further processing.
Figure 29:
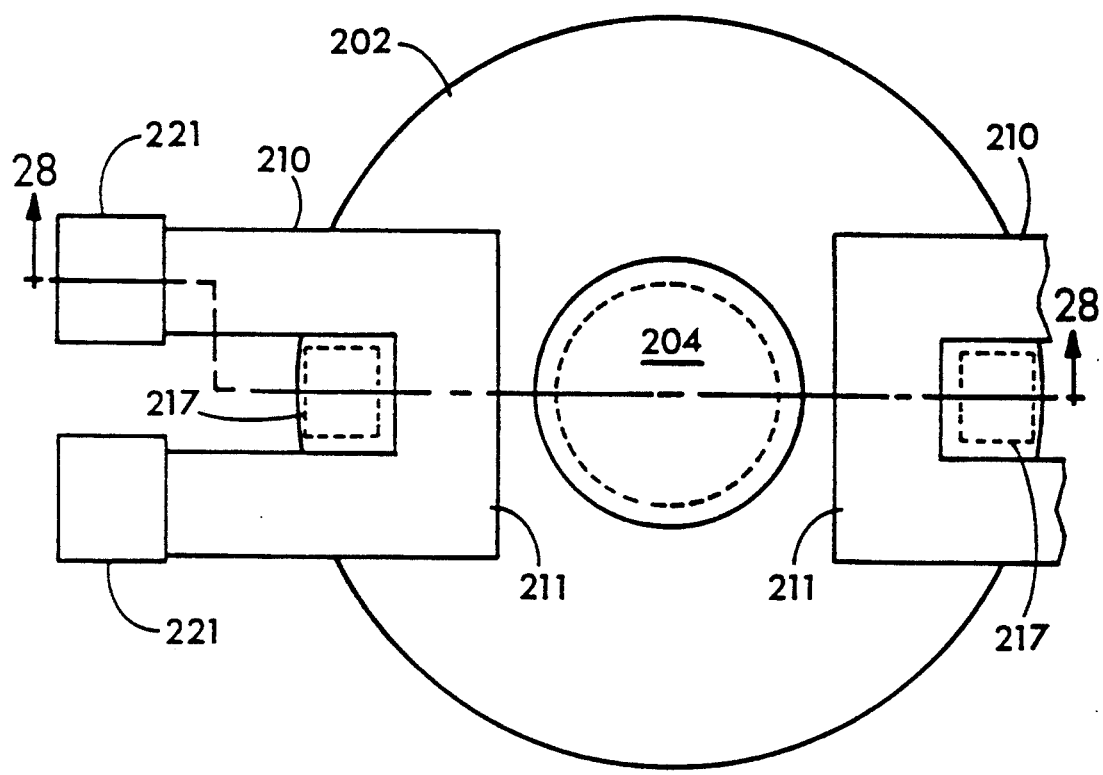
FIG. 29 is a plan view of the structure of FIG. 28.

With reference to FIGS. 28 and 29, a third layer of PiRL is spun on for contact protection in the areas 221 to about 2 μm and soft annealed. The protection layer is then patterned leaving the PiRL only over the contacts in the areas 221 and a plating base 222 of titanium and nickel is then sputtered on.

Figure 30:
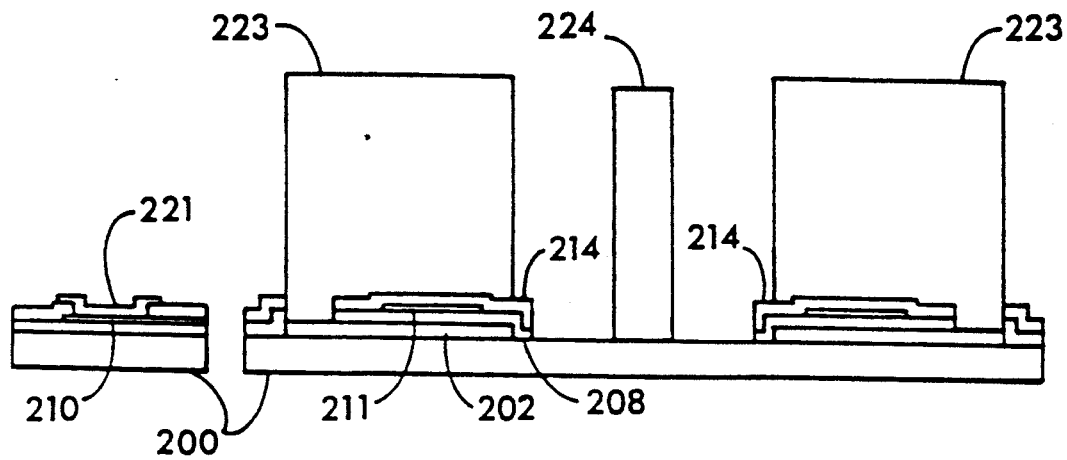
FIG. 30 is a cross-sectional view of the structure of FIG. 28 after further processing.
Figure 31:
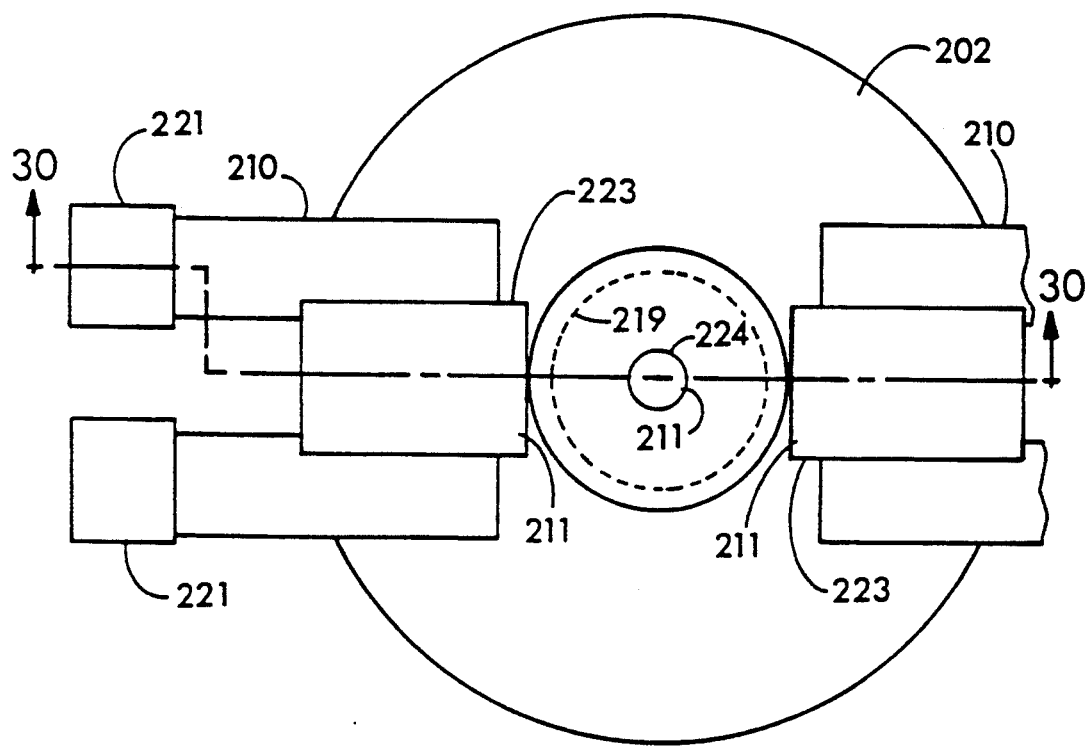
FIG. 31 is a plan view of the structure of FIG. 30.

With reference to FIGS. 30 and 31, PMMA is then cast onto the structure, an X-ray mask containing stator and hub definition is then aligned to the structure and the synchrotron X-ray exposure is made. After removal of the PMMA in the exposed areas, nickel is electroplated in and the entire remaining PMMA is exposed to synchrotron X-rays and developed to remove the PMMA, leaving the stator structures 223 in the central hub 224.

Figure 32:
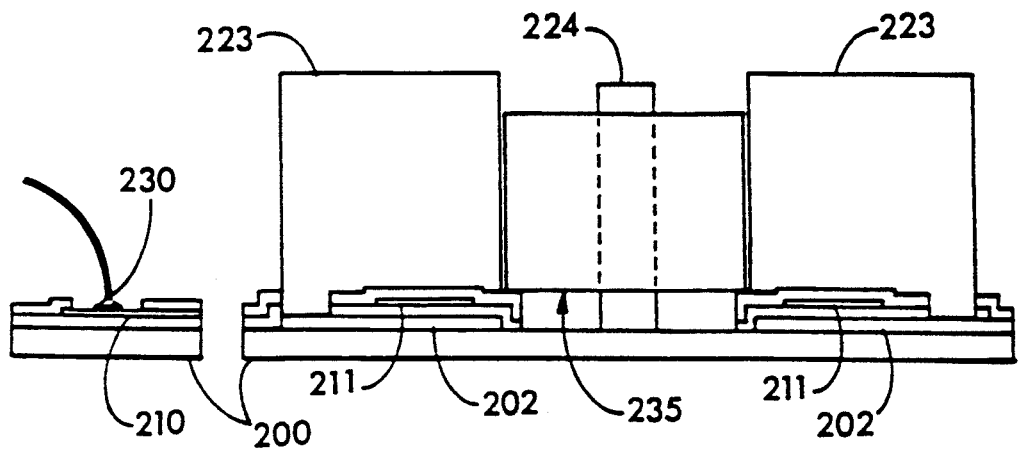
FIG. 32 is a cross-sectional view of the structure of FIG. 30 after further processing.

With reference to FIGS. 32 and 33, the plating base is then removed, the PiRL contact protection layer is removed, and the contact wires 230 are then bonded to the exposed areas of the conductors 210 to complete the circuit. The rotor 235, constructed separately on another substrate using the sacrificial layer technique shown in FIGS. 1–7, is then assembled onto the hub 224. As is illustrated in FIG. 33, the rotor preferably has a central bar section 236 which provides a low reluctance a flux path between the stator pole pieces 223 and a thinner peripheral ring section 237 which, with the openings 236, defines a high reluctance path perpendicular to the low reluctance path. The openings which accepts the hub is formed in the center bar. The fully assembled motor is also shown in simplified perspective view in FIG. 34.

The processing steps are described in more detail as follows:

FIRST LAYER

The magnetic flux path is patterned to provide the return path for the Stator.

The first step corresponds to steps 1-7 in the integrated processing sequence described above.

SECOND LAYER

1. Pattern aluminum winding layer.
2. Spin-on PiRL to 3 μm and bake at 210° C. for one minute on a hot plate.
3. Sputter four μm of aluminum.
4. Pattern the aluminum using a standard wet-edge process, for example, use 1375 Shipley photoresist, align winding layer to underlying nickel flux path layer, etch aluminum in standard phosphoric-acetic-nitric acid aluminum etch solution, and remove photoresist with commercial PR stripper, (e.g., Shipley 1165).
5. Spin-on second PiRL layer (3 μm thick) and bake at 210° C. for one minute on a hot plate.

THIRD LAYER

Pattern openings in PiRL layer for stator pole contacts underlying flux path layer and contacts to aluminum windings, as well as standoffs for the rotor.

6. Use the same processing sequence as in step 9 of the previous integrated stator winding process.
7. Bake the PiRL layer to 300° C. on a hot plate to hard anneal, making it non-developable in PMMA developer.
8. Sputter 150 Angstroms Ti and 150 Angstroms Ni plating base.

FOURTH LAYER

9. Spin third PiRL layer (about 2 μm) and pattern over the aluminum contact areas as in step 6 above.

FIFTH LAYER

Deep X-ray lithography layer for stator definition.

10. Use the same processing steps as in steps 11-17 of the first integrated winding process.
11. Remove the plating base as in step 18 of the prior integrated stator winding process.
12. Remove PiRL contact protection layer with 3:1 H$_2$O: NH$_4$OH.
13. Bond out aluminum current carrying wires using standard gold wire bonding.

SIXTH LAYER

Assemble rotor onto center post. The rotor is fabricated on a separate substrate and released via an unpatterned PiRL sacrificial layer which underlies the entire rotor structure.

It may be noted that the rotor may have gear teeth defined on its perimeter as shown above for driving external gears between the stator poles and, in turn, a mechanical system.

It is understood that the invention is not confirmed to the embodiments set forth herein as illustrative, but embraces such forms thereof as come within the scope of the following claims.

What is claimed is:

1. A micromechanical magnetically actuated device comprising:
    (a) a rotor having a periphery with a diameter less than about 200 μm and formed of a ferromagnetic material, a substrate, and means for mounting the rotor for rotation on the substrate about an axis of rotation, the rotor formed to have a high reluctance path therethrough and a low reluctance path therethrough;
    (b) a stator having pole pieces formed of ferromagnetic material mounted on the substrate around the rotor for directing magnetic flux to the rotor and means for providing a time varying magnetic flux through the pole pieces to the rotor which rotates about the axis of rotation of the rotor.

2. A micromechanical magnetically actuated device comprising:
    (a) a rotor having a periphery with a diameter less than about 200 μm and formed of a ferromagnetic material, a substrate, and means for mounting the rotor for rotation on the substrate about an axis of rotation, the rotor formed to have a high reluctance path therethrough and a low reluctance path therethrough;
    (b) a stator having pole pieces formed of ferromagnetic material mounted on the substrate around the rotor for directing magnetic flux to the rotor and means for providing a time varying magnetic flux through the pole pieces to the rotor which rotates about the axis of rotation of the rotor, wherein the means for providing the time varying magnetic flux includes an external electromagnet having two coils mounted around flux guides which extend to the stator pole pieces to provide flux to the stator pole pieces on opposite sides of the rotor, the stator pole pieces being formed in pairs which are arranged perpendicular to one another about the rotor.

3. A micromechanical magnetically actuated device comprising:
    (a) a rotor having a periphery with a diameter less than about 200 μm and formed of a ferromagnetic material, a substrate, and means for mounting the rotor for rotation on the substrate about an axis of rotation, the rotor formed to have a high reluctance path therethrough and a low reluctance path therethrough;
    (b) a stator having pole pieces formed of ferromagnetic material mounted on the substrate around the rotor for directing magnetic flux to the rotor and means for providing a time varying magnetic flux through the pole pieces to the rotor which rotates about the axis of rotation of the rotor, wherein the stator pole pieces are formed as two pairs of pole pieces arranged perpendicularly to one another about the rotor, and wherein the means for providing a time varying flux includes a conductor formed around each of the pole pieces to induce a magnetic field therein when current is passed through the conductor, wherein the stator also includes a flux return path structure on the substrate formed of a ferromagnetic material which connects the stator pole pieces to provide a flux return path therethrough so that a complete path is formed between opposite pairs of stator pole pieces through the rotor.

4. A micromechanical magnetically actuated device comprising:
    (a) a rotor having a periphery with a diameter less than about 200 μm and formed of a ferromagnetic material, a substrate, and means for mounting the rotor for rotation on the substrate about an axis of rotation, the rotor formed to have a high reluctance path therethrough and a low reluctance path therethrough;

(b) a stator having pole pieces formed of ferromagnetic material mounted on the substrate around the rotor for directing magnetic flux to the rotor and means for providing a time varying magnetic flux through the pole pieces to the rotor which rotates about the axis of rotation of the rotor, wherein the stator pole pieces are deposited by electroplating metal onto the substrate to a depth of at least 50 μm.

5. The device of claim 1 wherein the rotor and the stator pole pieces are formed of electro-plated nickel.

6. The device of claim 1 wherein the rotor has a circular outer ring which defines the outer periphery of the rotor and gear teeth on its outer periphery.

7. The device of claim 6 including a train of intermeshed gears mounted for rotation to the substrate, one of the gears engaged to the gear teeth on the periphery of the rotor.

8. A micromechanical magnetically actuated device comprising:

(a) a rotor having a periphery with a diameter less than about 200 μm and formed of a ferromagnetic material, a substrate, and means for mounting the rotor for rotation on the substrate about an axis of rotation, the rotor formed to have a high reluctance path therethrough and a low reluctance path therethrough;

(b) a stator having pole pieces formed of ferromagnetic material mounted on the substrate around the rotor for directing magnetic flux to the rotor and means for providing a time varying magnetic flux through the pole pieces to the rotor which rotates about the axis of rotation of the rotor, wherein the stator pole pieces are formed in two pairs arranged perpendicularly to one another about the rotor and including a flux return path structure formed of ferromagnetic material on the substrate which connects the stator pole pairs to provide a flux return path for each pair of pole pieces, wherein the means for providing a magnetic flux in the pole pieces includes a conductor formed around each of the pole pieces to induce a magnetic field therein when current is supplied to the conductors, and including electrical insulating material encasing the conductors around the pole pieces.

9. The device of claim 8 wherein the insulating material is polyimide having a first layer underneath the conductors and a second layer over the conductors to provide insulation for the conductors.

10. The device of claim 8 wherein the insulating material extends inwardly from the inward periphery of the stator pole pieces to provide a support for the rotor on which the rotor rotates.

11. A micromechanical rotor comprising:

a unitary rotor structure formed of a ferromagnetic metal having a circular periphery with a diameter less than about 200 μm, a vertical height less than about 200 μm, an outer ring which defines the outer periphery of the rotor structure, gear teeth formed on the outer periphery of the rotor structure, a center bar extending in one direction through the center of the rotor structure between opposite sides of the ring to provide a low reluctance path from one side of the rotor outer periphery to the other, with openings formed in the rotor structure on either side of the center bar between the center bar and the outer ring to provide a high reluctance path from one side of the rotor periphery to the other, and a central opening in the center bar to admit a hub on which the rotor structure rotates.

12. The micromechanical rotor of claim 11 wherein the rotor is formed of electro-plated ferromagnetic metal.

13. The micromechanical rotor of claim 12 wherein the metal is nickel.

* * * * *